United States Patent
Tsumura et al.

(10) Patent No.: US 7,785,715 B2
(45) Date of Patent: Aug. 31, 2010

(54) CURABLE COMPOSITION AND METHOD OF PREPARING SAME, LIGHT-SHIELDING PASTE, LIGHT-SHIELDING RESIN AND METHOD OF FORMING SAME, LIGHT-EMITTING DIODE PACKAGE AND SEMICONDUCTOR DEVICE

(75) Inventors: Manabu Tsumura, Settsu (JP); Masahito Ide, Settsu (JP); Katsuya Ouchi, Nishinomiya (JP); Masafumi Kuramoto, Anan (JP); Tomohide Miki, Anan (JP)

(73) Assignees: Kaneka Corporation, Kita-ku, Osaka-shi (JP); Nichia Corporation, Anan-shi, Tokushima (JP)

(*) Notice: Subject to any disclaimer, the term of this patent is extended or adjusted under 35 U.S.C. 154(b) by 1150 days.

(21) Appl. No.: 10/546,905

(22) PCT Filed: Feb. 25, 2004

(86) PCT No.: PCT/JP2004/002199

§ 371 (c)(1),
(2), (4) Date: May 5, 2006

(87) PCT Pub. No.: WO2004/076585

PCT Pub. Date: Sep. 10, 2004

(65) Prior Publication Data

US 2006/0243947 A1 Nov. 2, 2006

(30) Foreign Application Priority Data

Feb. 25, 2003 (JP) ............... 2003-047359
Feb. 25, 2003 (JP) ............... 2003-047360
Oct. 21, 2003 (JP) ............... 2003-361137

(51) Int. Cl.
  B32B 9/04 (2006.01)
  C08L 83/04 (2006.01)
  C08K 3/22 (2006.01)
(52) U.S. Cl. .............. 428/447; 428/480; 524/431; 524/588; 525/478; 525/479; 528/13; 528/15; 528/25; 528/31; 528/34
(58) Field of Classification Search .......... 528/34, 528/15; 257/40; 438/99
See application file for complete search history.

(56) References Cited

U.S. PATENT DOCUMENTS

| 5,204,408 | A | 4/1993 | Konno et al. |
| 5,296,298 | A | 3/1994 | Fujimoto et al. |
| 5,391,678 | A | 2/1995 | Bard et al. |
| 5,409,995 | A | 4/1995 | Iwahara et al. |
| 5,523,374 | A | 6/1996 | Bard et al. |
| 5,580,925 | A | 12/1996 | Iwahara et al. |
| 6,187,890 | B1 | 2/2001 | Fehn et al. |
| 6,355,946 | B1 | 3/2002 | Ishinaga |
| 6,592,999 | B1 | 7/2003 | Anderson et al. |
| 6,791,259 | B1* | 9/2004 | Stokes et al. ........ 313/503 |
| 7,371,462 | B2* | 5/2008 | Tsumura et al. ....... 428/447 |
| 2002/0156186 | A1* | 10/2002 | Bublewitz et al. ...... 525/100 |
| 2003/0144420 | A1 | 7/2003 | Tsumura et al. |
| 2003/0232222 | A1 | 12/2003 | Anderson et al. |
| 2004/0126504 | A1* | 7/2004 | Ouchi et al. ........ 428/1.1 |
| 2005/0042463 | A1 | 2/2005 | Anderson et al. |

FOREIGN PATENT DOCUMENTS

| EP | 0 803 529 A1 | 10/1997 |
| EP | 1 369 458 A1 | 12/2003 |
| EP | 1 505 121 A1 | 2/2005 |
| JP | 50-100 | 1/1975 |
| JP | 59-155483 A | 9/1984 |
| JP | 62-20733 A | 1/1987 |
| JP | 62-207333 A | 9/1987 |
| JP | 3247686 A | 11/1991 |
| JP | 5-140459 A | 6/1993 |
| JP | 8157720 A | 6/1996 |
| JP | 8-183934 A | 7/1996 |

(Continued)

OTHER PUBLICATIONS

Salamone C. Joseph, Polymeric Materials Encyclopedia, Jul. 1996, CRC, 1 edition, p. 1322.*

(Continued)

*Primary Examiner*—Marc S Zimmer
(74) *Attorney, Agent, or Firm*—Connolly Bove Lodge & Hutz LLP

(57) ABSTRACT

A light-shielding paste which contains a thermoplastic resin and an inorganic member as essential components or which contains a thermosetting resin and an inorganic member as essential components is provided. A curable composition and light-shielding paste comprising the composition are provided which contains, as essential components, (A) an organic compound comprising an organic main chain containing at least two carbon-carbon double bonds reactive with a SiH group in each molecule, (B) a silicon compound having at least two SiH groups in each molecule, (C) a hydrosilylation catalyst, (D) a silane coupling agent and/or an epoxy group-containing compound, (E) a silanol condensation catalyst, and (F) an inorganic member. The curable composition can further contain (G) silica. Also provided is a method of forming a light-shielding resin layer on a LED package having an aperture comprising a bottom and sidewalls. The curable composition is excellent in light-shielding ability.

30 Claims, No Drawings

FOREIGN PATENT DOCUMENTS

| | | | |
|---|---|---|---|
| JP | 9316293 A | 12/1997 |
| JP | 10003270 A | 1/1998 |
| JP | 2000124475 A | 4/2000 |
| JP | 2000-183407 A | 6/2000 |
| JP | 2000344895 A | 12/2000 |
| JP | 2001-011210 | 1/2001 |
| JP | 2001-11210 A | 1/2001 |
| JP | 2001-118865 | 4/2001 |
| JP | 2001-118865 A | 4/2001 |
| JP | 2002080733 A | 3/2002 |
| JP | 2002194215 A | 7/2002 |
| JP | 2002-217459 | 8/2002 |
| JP | 2002-217459 A | 8/2002 |
| JP | 2002235005 A | 8/2002 |
| JP | 3354973 B2 | 9/2002 |
| JP | 2002-314140 A | 10/2002 |
| JP | 2002-317048 A | 10/2002 |
| JP | 2002-317408 A | 10/2002 |
| JP | 2002324920 A | 11/2002 |
| JP | 2002338833 A | 11/2002 |
| JP | 2003128921 A | 5/2003 |
| WO | WO 02/053648 A1 | 7/2002 |
| WO | WO03091338 A1 * | 6/2003 |

OTHER PUBLICATIONS

George Wypych, Handbook of Fillers, 2000, Chem Tec, 2nd Edition, p. 246.*
Patent Cooperation Treaty International Preliminary Report on Patentability (Chapter I of the Patent Cooperation Treaty), from Corresponding International Application No. PCT/JP2004/002199, dated Mar. 2, 2006, 7 pages.
International Search Report from Corresponding International Application No. PCT/JP2004/002199, dated Jun. 1, 2004, 1 page.
Supplementary European Search Report on EP 04 71 4432.
Edited by the Society of Rubber Industry, Japan Gomu Kogyo Gijutsu Iinkai et al., Taisei-sha Kabushiki Kaisha, "Fira Handbook," 1987, pp. 198-218.
Kiyono, Manabu et al., "Sanka Titanium Bussei to Oyo Gijutsu," 1991, pp. 75-155.

* cited by examiner

CURABLE COMPOSITION AND METHOD OF PREPARING SAME, LIGHT-SHIELDING PASTE, LIGHT-SHIELDING RESIN AND METHOD OF FORMING SAME, LIGHT-EMITTING DIODE PACKAGE AND SEMICONDUCTOR DEVICE

RELATED APPLICATIONS

This application is a nationalization of PCT application PCT/JP2004/002199 filed on Feb. 25, 2004, claiming priority based on Japanese Application No. 2003-047359 filed on Feb. 25, 2003, Japanese Application No. 2003-047360 filed on Feb. 25, 2003, and Japanese Application No. 2003-361137 filed on Oct. 21, 2003, the contents of which are incorporated herein by reference in their entirety.

TECHNICAL FIELD

The present invention relates to a curable composition, a method of preparing curable compositions, a light-shielding paste, a light-shielding resin resulting from curing of such a light-shielding paste, a method of forming light-shielding resins, a light-emitting diode package covered with a light-shielding resin, and a light-emitting diode as a semiconductor device. More particularly, it relates to a curable composition excellent in adhesive properties and having high light-shielding ability, preferably a curable composition which is, in addition, low in flow leveling property and adequate in workability. It also relates to a method of efficiently forming a light-shielding resin layer on the LED package aperture sidewalls alone, and a light-emitting diode with a light-shielding layer formed on the LED package aperture sidewalls alone.

BACKGROUND ART

With the recent enlargement of the field of applications of light-emitting diodes (hereinafter also referred to as "LEDs"), light-emitting diodes which are more highly reliable and capable of emitting high-brightness light for a long period of time have been demanded. A light-emitting diode is constituted of external electrodes, a LED chip, a package comprising an aperture having a bottom surface and sidewalls for efficiently taking out the light from the LED chip, and a sealing member. On the package bottom, the external electrodes are formed by monolithic molding, and there is formed a high-reflectivity noble metal film for satisfactorily taking out the light outwardly. Since, on the other hand, the package is generally made of an organic resin, continued irradiation of the sidewalls with light causes problems, for example a decrease in adhesion to the sealing member due to deterioration of the package resin, a decrease in reflectivity due to discoloration of the package resin and the resulting decrease in brightness of the LED.

Therefore, a light-shielding paste for protecting the package resin has been demanded for the purpose of avoiding the direct light irradiation of the LED package and/or for the purpose of preventing the decrease in reflectivity due to discoloration of the package resin.

In the prior art, a technology applicable to adhesive sheets, finished cloths and the like has been proposed which utilizes a curable composition comprising a organosilicon compound, which is an addition reaction-curable (hydrosilylated) silicone having epoxy group- and alkoxy group-bound silicon atoms, and an organoaluminum compound and showing good adhesive properties (Japanese Kokai Publication Hei-08-183934, Japanese Kokai Publication Hei-05-140459).

From the optical characteristics viewpoint, however, the materials obtained by this technology are not suited for use as the light-shielding resins for light-emitting diodes.

Further, a technology of improving the adhesive properties of addition reaction-curable (hydrosilylated) liquid compositions by adding an epoxy resin and an aluminum compound has been proposed (Japanese Patent No. 3354973). However, there is no disclosure therein about such light-shielding resins for light-emitting diodes.

Further, it has been disclosed that when a condensation reaction-curable silicone is used as a sealing material for building joints, the addition of a borate ester thereto enables manifestation of good adhesion to adherends even when the joints are shallow (Japanese Kokai Publication Sho-59-155483). However, this system is a room temperature curing one, and there is no disclosure either about effect manifestation upon heating for curing or about effect manifestation in the case of application to addition reaction type systems differing therefrom in mode of reaction.

On the other hand, it is known that curing products obtained from a curable composition comprising an organic compound having, within the molecule, at least two carbon-carbon double bonds reactive with a SiH group, a compound containing at least two SiH groups within the molecule, and a hydrosilylation catalyst are applicable as sealants for light-emitting diodes (Japanese Kokai Publication 2002-314140). However, there is no disclosure about the adhesion after light irradiation, which is required of light-shielding resins for light-emitting diodes.

Meanwhile, the light-shielding layers can indeed be formed by curing a curable composition but there is a problem in that when the curable composition is high in flow leveling property, it flows onto the package bottom during curing, leading to failure to obtain light-shielding layers having a desired thickness. When the curable composition is high in flow leveling property, another problem arises, namely the bottom is stained and, for example, it becomes impossible to gain electric access to lead frame members disposed on the bottom.

Furthermore, it is also a problem that no effective method is available to coat the LED package aperture sidewalls alone. By saying "to coat the LED package aperture sidewalls alone" herein, it is meant that even the case where the light-shielding paste of the invention flows out onto those portions of the bottom which are in the vicinity of the sidewalls and is cured in that state without producing any adverse effect on the performance characteristics of the final product light-emitting diodes is included as well within the meaning thereof.

SUMMARY OF THE INVENTION

Accordingly, it is an object of the present invention to provide a curable composition excellent in adhesive properties and having high light-shielding ability, a curable composition which is, in addition, low in fluidity, a method of preparing such a curable composition, a light-shielding paste comprising the curable composition, a curing product, a light-shielding resin resulting from curing of the light-shielding paste, and a light-emitting diode with the LED package aperture sidewalls alone shielded against light by the light-shielding paste and/or light-shielding resin.

Another object of the invention is to provide a method of efficiently forming a light-shielding resin layer on the LED package aperture sidewalls alone, a light-shielding paste suited for such method, a light-shielding resin formed by such method, a LED package coated with the light-shielding resin on the sidewalls, and a light-emitting diode with a light-shielding layer formed on the LED package aperture sidewalls alone by the above method.

As a result of intensive investigations made by them to accomplish such objects, the present inventors found that the above objects can be achieved by:

A light-shielding paste
which contains a thermoplastic resin and an inorganic member as essential components;

A light-shielding paste
which contains a thermosetting resin and an inorganic member as essential components;

A curable composition
which contains, as essential components, (A) an organic compound comprising an organic main chain containing at least two carbon-carbon double bonds reactive with a SiH group in each molecule, (B) a silicon compound having at least two SiH groups in each molecule, (C) a hydrosilylation catalyst, (D) a silane coupling agent and/or an epoxy group-containing compound, (E) a silanol condensation catalyst, and (F) an inorganic member;

The above curable composition
which further contains (G) silica;

The above curable composition
which shows such a flow leveling property that when the composition is allowed to stand on a glass substrate inclined at an angle of 80 degrees at 100° C. for 1 hour, the flow-out distance is not longer than 2 cm;

A light-shielding paste
which comprises the above curable composition; or,

A method of forming a light-shielding resin layer on a LED package having an aperture comprising a bottom and sidewalls and formed of a molding resin by a monolithic process with the respective ends of an external positive electrode and an external negative electrode being exposed at a predetermined distance on the aperture bottom
which method comprises (1) applying a light-shielding paste to a substrate;

(2) bringing the LED package aperture into close contact therewith; and (3) heating the LED package with the aperture facing upward; and thereby the light-shielding paste is allowed to spread along the package sidewalls alone.

Such findings have led to completion of the present invention.

DETAILED DISCLOSURE OF THE INVENTION

In the following, the present invention is described in detail.

First Aspect of the Invention

The light-shielding paste so referred to herein comprises a resin and an inorganic member as essential components and, where necessary, contains one or more of other viscosity modifiers, adhesiveness providing agents, solvents and other additives. The light-shielding paste is applied to an adherend and protects the adherend from light.

The light-shielding paste of the invention includes ones comprising a thermoplastic resin and an inorganic member as essential components as wells as ones comprising a thermosetting resin and an inorganic member as essential components.

The thermoplastic resin to be used in the light-shielding paste of the invention may be any of various kinds. Thus, for example, it includes, but is not limited to, acrylic resins, typically poly(methyl methacrylate)-based resins such as methyl methacrylate homopolymers, or random, block or graft polymers of methyl methacrylate and another monomer, or other polymers, and poly(butyl acrylate)-based resins such as butyl acrylate homopolymers, or random, block or graft polymers of butyl acrylate and another monomer, or other polymers; polycarbonate-type resins such as polycarbonate resins containing bisphenol A, 3,3,5-trimethylcyclohexylidenebisphenol or the like as a monomer structure (APEC, product of Teijin, etc.); cycloolefin resins such as resins resulting from homopolymerization or copolymerization of norbornene derivatives, vinyl monomers and so forth, resins resulting from ring-opening metathetic polymerization of norbornene derivatives, or hydrogenation products derived therefrom; olefin-maleimide-based resins such as ethylene-maleimide copolymers; polyester resins such as polyesters resulting from polycondensation of a bisphenol such as bisphenol A or bis(4-(2-hydroxyethoxy)phenyl) fluorine and/or a diol such as diethylene glycol and a phthalic acid such as terephthalic acid or isophthalic acid and/or an aliphatic dicarboxylic acid; polyethersulfone resins; polyarylate resins; poly(vinyl acetal) resins; polyethylene resins; polypropylene resins; polystyrene resins: polyamide resins; silicone resins; fluororesins; etc.; and, further, rubber-like resins such as natural rubbers and EPDM.

From the viewpoint of adhesion to LED package sidewalls, acrylic resins, polyamide resins, and polyester resins are preferred. From the light resistance viewpoint, silicone resins, fluororesins and the like are preferred.

The thermoplastic resin may have a crosslinking group(s). For example, it may have a carbon-carbon double bond(s) reactive with a SiH group and/or a SiH group(s) within the molecule. In view of the tendency for the resulting crosslinking product to have an increased level of toughness, it is preferred that it has at least one carbon-carbon double bond reactive with a SiH group and/or at least one SiH group per molecule on average. As other crosslinking groups, there may be mentioned epoxy, amino, radical-polymerizable unsaturated groups, carboxyl, isocyanato, hydroxyl, alkoxysilyl groups, etc. In view of the tendency for the resulting crosslinking product to have an increased level of heat resistance, the occurrence of at least one crosslinking group per molecule on average is preferred.

The molecular weight of the thermoplastic resin is not particularly restricted but, from the applicability viewpoint, the number average molecular weight is preferably not more than 10,000, more preferably not more than 5,000. The molecular weight distribution is not particularly restricted, either. In view of the tendency for the resulting mixture to have a lower viscosity and better applicability, however, the molecular weight distribution is preferably not more than 3, more preferably not more than 2, still more preferably not more than 1.5. The number average molecular weight can be determined by gel permeation chromatography.

The thermoplastic resin may comprise one single species or a combination of a plurality of species.

The amount of the thermoplastic resin in the light-shielding paste is not particularly restricted but preferably is 0.1 to 90% by weight of the total weight of the light-shielding paste of the invention. From the good applicability viewpoint, a preferred range of amount to be used is not less than 10% by weight, more preferably not less than 40% by weight, still more preferably not less than 60% by weight, most preferably not less than 80% by weight, of the whole amount of the light-shielding paste. When the amount is smaller, the applicability tends to decrease and the light-shielding capacity tends to decrease due to defective coating results. From the good light-shielding capacity viewpoint, a preferred range of amount to be used is not beyond 90% by weight, more preferably not beyond 80% by weight, still more preferably not beyond 60% by weight, particularly preferably not beyond 50% by weight, most preferably not beyond 30% by weight, of the whole amount of the light-shielding paste. When the amount of the thermoplastic resin is excessive, the proportion of the inorganic member decreases and, accordingly, the light-shielding capacity tends to decrease. Therefore, a preferred range of amount to be used for attaining a proper balance between applicability and light-shielding capacity is 10% by weight to 80% by weight, more preferably 10% by weight to 50% by weight, still more preferably 10% by weight to 30% by weight, of the whole amount of the light-shielding paste.

The thermoplastic resin may be directly admixed with the inorganic member to be mentioned later herein or may be uniformly admixed therewith using a solvent, for instance. The solvent may be removed to attain a uniformly dispersed state and/or a uniformly mixed state. In using the thermoplastic resin in the form of a dispersion, the average particle diameter may be selected at any of various levels. A preferred lower limit to the average particle diameter is 10 nm, and a preferred upper limit to the average particle diameter is 10 µm. The particle system may show a certain distribution and may be a monodisperse system or show a plurality of peak particle diameters. From the viewpoint of low light-shielding paste viscosity and good applicability, however, it is desirable that the coefficient of variation in particle diameter be not more than 10%.

The thermosetting or heat-curable resin to be used in the light-shielding paste of the invention may be any of various kinds. Thus, the thermosetting resin includes, but is not limited to, epoxy resins, cyanate ester resins, phenol resins, polyimide resins, urethane resins, bismaleimide resins, etc. Among these, epoxy resins are preferred in view of their being excellent in practical performance characteristics, such as adhesive properties.

As the epoxy resins, there may be mentioned, for example, novolak phenol-based epoxy resins, biphenyl-based epoxy resins, dicyclopentadiene-based epoxy resins, bisphenol F diglycidyl ether, bisphenol A diglycidyl ether, 2,2'-bis(4-glycidyloxycyclohexyl)propane, 3,4-epoxycyclohexylmethyl-3,4-epoxycyclohexanecarboxylate, vinylcyclohexene dioxide, 2-(3,4-epoxycyclohexyl)-5,5-spiro(3,4-epoxycyclohexane)-1,3-dioxane, bis(3,4-epoxycyclohexyl)adipate, bisglycidyl 1,2-cyclopropanedicarboxylate, triglycidyl isocyanurate, monoallyl diglycidyl isocyanurate, diallyl monoglycidyl isocyanurate, and like epoxy resins as cured with an aliphatic acid anhydride such as hexahydrophthalic anhydride, methylhexahydrophthalic anhydride, trialkyltetrahydrophthalic anhydrides or hydrogenated methylnadic anhydride. These epoxy resins and curing agents may respectively be used singly or in the form of a combination of a plurality of species.

The thermosetting resin may comprise one single species or a combination of a plurality of species.

The amount of the thermosetting resin in the light-shielding paste is not particularly restricted but preferably is 0.1 to 90% by weight of the total weight of the light-shielding paste of the invention. From the good applicability viewpoint, a preferred range of amount to be used is not less than 10% by weight, more preferably not less than 40% by weight, still more preferably not less than 60% by weight, most preferably not less than 80% by weight, of the whole amount of the light-shielding paste. When the amount is smaller, the applicability tends to decrease and the light-shielding capacity tends to decrease due to defective coating results. From the good light-shielding capacity viewpoint, a preferred range of amount to be used is not beyond 90% by weight, more preferably not beyond 80% by weight, still more preferably not beyond 60% by weight, particularly preferably not beyond 50% by weight, most preferably not beyond 30% by weight, of the whole amount of the light-shielding paste. When the amount of the thermosetting resin is excessive, the proportion of the inorganic member decreases and, accordingly, the light-shielding capacity tends to decrease. Therefore, a preferred range of amount to be used for attaining a proper balance between applicability and light-shielding capacity is 10% by weight to 80% by weight, more preferably 10% by weight to 50% by weight, still more preferably 10% by weight to 30% by weight, of the whole amount of the light-shielding paste.

The thermosetting resin may be directly admixed with the inorganic member to be mentioned later herein or may be uniformly admixed therewith using a solvent, etc. The solvent may be removed to attain a uniformly dispersed state and/or a uniformly mixed state. In using the thermosetting resin in the form of a dispersion, the average particle diameter may be selected at any of various levels. A preferred lower limit to the average particle diameter is 10 nm, and a preferred upper limit to the average particle diameter is 10 µm. The particle system may show a certain distribution and may be a monodisperse system or show a plurality of peak particle diameters. From the viewpoint of low light-shielding paste viscosity and good moldability, however, it is desirable that the coefficient of variation in particle diameter be not more than 10%.

Preferred as the thermosetting resin to be used in the light-shielding paste from the light resistance and/or heat resistance viewpoint are such thermosetting resins as specified in claim 5.

The inorganic member to be used in the practice of the invention is desired to be dispersed in the resin and reflect the light from the outside. Such inorganic member includes, for example, oxides such as alumina, titanium oxide, tin oxide, zinc oxide, stannous oxide, calcium oxide, magnesium oxide and beryllium oxide; metal nitrides such as boron nitride, silicon nitride and aluminum nitride; metal carbides such as SiC; metal carbonates such as calcium carbonate, potassium carbonate, sodium carbonate, magnesium carbonate and barium carbonate; metal hydroxides such as aluminum hydroxide and magnesium hydroxide; aluminum borate, barium titanate, calcium silicate, clay, gypsum, barium sulfate, mica, diatomaceous earth, terra alba, inorganic balloons, fluorescent substances, etc. These species may be used singly or two or more of them may be used in combination.

Where appropriate, the inorganic member may be surface-treated. The surface treatment includes alkylation treatment, trimethylsilylation treatment, silicone treatment, treatment with a coupling agent, etc.

In that case, the coupling agent may be a silane coupling agent. The silane coupling agent is not particularly restricted but may be any of those compounds which have, within the molecule, at least one functional group reactive with an organic group and at least one hydrolyzable silyl group.

The functional group reactive with an organic group is preferably at least one functional group selected from among epoxy, methacryl, acryl, isocyanato, isocyanurato, vinyl and carbamato groups from the handleability viewpoint. From the viewpoint of curability and adhesive properties, epoxy, methacryl and acryl groups are particularly preferred. Preferred as the hydrolyzable silyl group from the handleability viewpoint are alkoxysilyl groups and, from the reactivity viewpoint, methoxysilyl and ethoxysilyl groups are particularly preferred.

As preferred examples of the silane coupling agent, there may be mentioned epoxy functional group-containing alkoxysilanes such as 3-glycidoxypropyltrimethoxysilane, 3-glycidoxypropyltriethoxysilane, 2-(3,4-epoxycyclohexyl)ethyltrimethoxysilane and 2-(3,4-epoxycyclohexyl)ethyltriethoxysilane; and methacryl or acryl group-containing alkoxysilanes such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane and acryloxymethyltriethoxysilane.

The amount of the inorganic member in the light-shielding paste is not particularly restricted but preferably is 0.1 to 90% by weight of the total weight of the light-shielding paste of the invention. From the good applicability viewpoint, a preferred amount to be used is not more than 80% by weight, more preferably not more than 70% by weight, still more preferably not more than 50% by weight, further preferably not more than 40% by weight, most preferably not more than 30% by weight, of the whole amount of the light-shielding paste. When the amount is greater, the applicability tends to decrease and the light-shielding capacity tends to decrease due to defective coating results. From the good light-shielding capacity viewpoint, a preferred amount to be used is not less than 5% by weight, more preferably not less than 10% by weight, still more preferably not less than 30% by weight, particularly preferably not less than 40% by weight, most preferably not less than 50% by weight, of the whole amount of the light-shielding paste. Thus, a preferred amount to be used for attaining a proper balance between applicability and light-shielding capacity is 10% by weight to 80% by weight, more preferably 20% by weight to 70% by weight, still more preferably 30% by weight to 60% by weight, of the whole amount of the light-shielding paste.

When the dispersibility and light-shielding capacity are taken into consideration, the inorganic member may take various forms, such as spherical, needle-like, and flaky forms.

The inorganic member to be judiciously used may be diverse, from 1 nm to 100 μm, in average particle diameter. From the viewpoint of dispersibility in resins, the average particle diameter is preferably not more than 1.0 μm, preferably not more than 0.8 μm, more preferably not more than 0.4 μm. From the hiding power viewpoint, it is preferably not smaller than 0.1 μm, more preferably not smaller than 0.2 μm. Thus, for attaining a balance between dispersibility and hiding power, the average particle diameter is preferably 0.1 μm to 1.0 μm. The average particle diameter can be actually measured based on an electron photomicrograph.

Titanium oxide, in particular, can be adequately used as the inorganic member in the light-shielding paste in view of its high whiteness, high hiding power, and good durability. From the viewpoint of durability of the light-shielding resin, the rutile form is preferred as its crystalline form. From the viewpoint of dispersibility in resins, its average particle diameter is preferably not more than 1.0 μm, more preferably not more than 0.8 μm, still more preferably not more than 0.4 μm. From the hiding power viewpoint, it is not less than 0.1 μm, more preferably not less than 0.2 μm. Thus, for attaining a balance between dispersibility and hiding power, the average particle diameter is preferably 0.1 μm to 1.0 μm. The average particle diameter of titanium oxide is measured based on an electron photomicrograph using an image analyzer (Luzex IIIU).

Those titanium oxide species produced either by the sulfuric acid method or by the chlorine method can be appropriately used. Those species which have been surface-treated with a hydrate oxide of Al, Si or the like so as to improve the affinity for resins may also be suitably used. Thus, for example, Tipaque R-820, R-680, CR-50-2, CR-97, CR-60, CR-60-2 (products of Ishihara Sangyo Kaisha, Ltd.), etc. can be adequately used.

The amount of titanium oxide in the light-shielding paste is not particularly restricted but preferably is 0.1 to 90% by weight of the total weight of the light-shielding paste of the invention. From the good applicability viewpoint, a preferred amount to be used is not more than 80% by weight, more preferably not more than 70% by weight, still more preferably not more than 50% by weight, further preferably not more than 40% by weight, most preferably not more than 30% by weight, of the whole amount of the light-shielding paste. When the amount is greater, the applicability tends to decrease and the light-shielding capacity tends to decrease due to defective coating results. From the good light-shielding capacity viewpoint, a preferred amount to be used is not less than 5% by weight, more preferably not less than 10% by weight, still more preferably not less than 30% by weight, particularly preferably not less than 40% by weight, most preferably not less than 50% by weight, of the whole amount of the light-shielding paste. Thus, a preferred amount to be used for attaining a proper balance between applicability and light-shielding capacity is 10% by weight to 80% by weight, more preferably 20% by weight to 70% by weight, still more preferably 30% by weight to 60% by weight, of the whole amount of the light-shielding paste.

When alumina, silica, boron nitride, aluminum nitride or the like is used as the inorganic member, high levels of weathering resistance can results and the reflectivity can be maintained at high levels.

In addition to their hiding effect, the fluorescent substances usable as the inorganic member can convert the blue light from a LED chip to a white light and, further, can improve the characteristics of the light-emitting diode. When a diffusing agent is incorporated, together with a fluorescent substance, in the light-shielding paste, it is also possible to further increase the directivity. As for specific examples of the diffusing agent, inorganic ones such as barium titanate, titanium oxide, aluminum oxide and silicon oxide, and organic ones such as guanamine resins are judiciously used. The fluorescent substances are used to convert the visible light or ultraviolet light emitted by a nitride compound semiconductor to different emission wavelengths. Therefore, various species are used according to the emission wavelength of the light emitted from the light-emitting layer of the LED chip in question and/or the desired emission wavelength to be emitted from the light-emitting diode. In particular, when the light emitted from the LED chip and the light from the fluorescent substance emitting light upon excitation by the light from the LED chip are in a complementary relation, a white or whity light can be emitted.

As such fluorescent substances, there may be mentioned cerium-activated yttrium aluminum garnet type fluorescent substances, perylene derivatives, copper- or aluminum-activated zinc cadmium sulfide, manganese-activated magnesium titanium oxide, and various other species. These fluorescent substances may be used singly or as a mixture of two or more species. In particular, the cerium-activated yttrium aluminum garnet type fluorescent substances ($ReRe'_5O_{12}$:Ce, where Re represents at least one species selected from among Y, Gd, Lu, Sc and La and Re' represents at least one species selected from among Al, In, B and Tl) have a garnet structure and therefore are resistant to heat, light and water and can shift the excitation spectrum peak to about 450 nm. Further, they have an emission peak in the vicinity of 530 nm and can give a broad emission spectrum trailing to 700 nm. In addition, partial substitution of Ga for Al in their composition results in shifting of the emission wavelength to the shorter wavelength side, and partial substitution of Gd for Y in their composition can result in shifting of the emission wavelength to the longer wavelength side. Since various emission wavelengths can be continuously obtained by varying the composition in that manner, they are particularly preferred as the fluorescent substances. If desired, Lu, Sc or La may be substituted for part of yttrium, or In, B or Tl may be substituted for part of aluminum, to thereby adjust the emission wavelength to the longer or shorter wavelength side. Furthermore, the absorption wavelength can also be adjusted by incorporating trace amounts of Tb or Cr therein in addition to cerium.

From the good conversion viewpoint, the fluorescent substances are used preferably in an amount of not less than 5% by weight, more preferably not less than 10% by weight, still more preferably not less than 30% by weight, particularly preferably not less than 40% by weight, most preferably not less than 50% by weight, of the whole light-shielding paste weight. The upper limit to the amount to be used is preferably not more than 80% by weight, more preferably not more than 60% by weight, of the whole light-shielding paste weight.

Now, the curable composition of the present invention is described.

The curable composition comprises, as essential components, (A) an organic compound containing, in each molecule thereof, at least two carbon-carbon double bonds reactive with a SiH group, (B) a silicon compound containing at least two SiH groups in each molecule, (C) a hydrosilylation catalyst, (D) a silane coupling agent and/or an epoxy group-containing compound, (E) a silanol condensation catalyst, and (F) an inorganic member.

First, the component (A) is described.

The component (A) is not particularly restricted but may be any organic compound having at least two carbon-carbon double bonds reactive with a SiH group in each molecule. The organic compound is preferably one comprising C, H, N, O, S and/or halogen, as exclusive constituent elements, not a polysiloxane-organic block copolymer, a polysiloxane-organic graft copolymer or a like siloxane unit (Si—O—Si)-containing one. Siloxane unit-containing ones have gas permeability and cissing problems.

The sites of occurrence of the carbon-carbon double bonds reactive with a SiH group are not particularly restricted but may be anywhere within the molecule.

The component (A) organic compound may be classified as an organic polymer type compound or as an organic monomer type compound.

Usable as the organic polymer type compound are, for example, polyether type, polyester type, polyarylate type, polycarbonate type, saturated hydrocarbon type, unsaturated hydrocarbon type, polyacrylic ester type, polyamide type, phenol-formaldehyde type (phenol resin type), and polyimide type compounds.

The organic monomer type compound includes, for example, phenol type, bisphenol type, benzene, naphthalene or like aromatic hydrocarbon type compounds; aliphatic (e.g. straight chain, alicyclic) hydrocarbon type compounds; heterocyclic type compounds; and mixtures of these.

The carbon-carbon double bonds reactive with a SiH group in component (A) are not particularly restricted but, from the reactivity viewpoint, those groups represented by the following general formula (II):

wherein $R^2$ represents a hydrogen atom or a methyl group, are preferred. From the material availability viewpoint, the group represented by

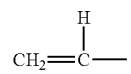

is particularly preferred.

Preferred as the carbon-carbon double bonds reactive with a SiH group in component (A) are alicyclic groups having a partial structure represented by the following general formula (III):

wherein each $R^3$ represents a hydrogen atom or a methyl group and the two $R^3$ groups may be the same or different, in the ring structure, since high heat resistance can be given to curing products. From the material availability viewpoint, alicyclic groups having a partial structure represented by the following formula

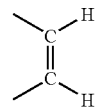

in the ring structure are preferred.

The carbon-carbon double bonds reactive with a SiH group each may be directly bonded to the skeletal portion of component (A) or covalently bonded thereto via a bivalent or polyvalent substituent.

The bivalent or polyvalent substituent is not particularly restricted but may be any substituent containing 0 to 10 carbon atoms, preferably one containing C, H, N, O, S and halogen, as exclusive constituent elements. Examples of such substituent are:

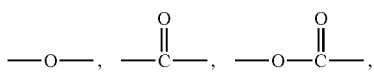

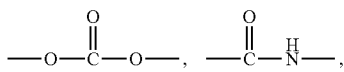

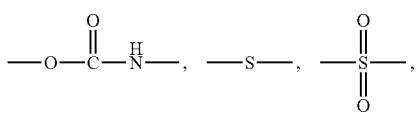

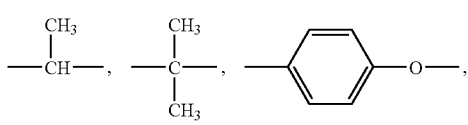

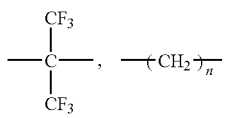

(n representing a number of 1 to 10),

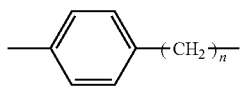

(n representing a number of 0 to 4), and

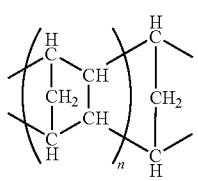

(n representing a number of 0 to 4), etc. Two or more of these bivalent or polyvalent substituents may be covalently bonded together to form one bivalent or polyvalent substituent.

As examples of the group covalently bonded to such a skeletal portion as mentioned above, there may be mentioned vinyl, allyl, methallyl, acryl, methacryl, 2-hydroxy-3-(allyloxy)propyl, 2-allylphenyl, 3-allylphenyl, 4-allylphenyl, 2-(allyloxy)phenyl, 3-(allyloxy)phenyl, 4-(allyloxy)phenyl, 2-(allyloxy)ethyl, 2,2-bis(allyloxymethyl)butyl, 3-allyloxy-2,2-bis(allyloxy)propyl,

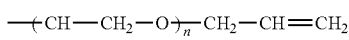

(n representing a number satisfying the relation 5 n 2),

(R representing a bivalent group selected from among

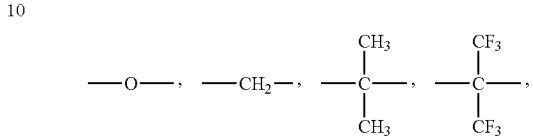

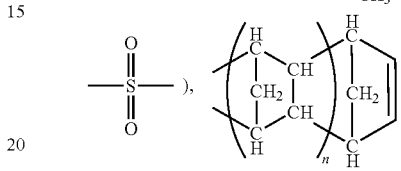

(n representing a number of 0 to 4), and the like.

As specific examples of component (A), there may be mentioned diallyl phthalate, triallyl trimellitate, diethylene glycol bis(allyl carbonate), trimethylolpropane diallyl ether, pentaerythritol triallyl ether, 1,1,2,2-tetraallyloxyethane, diallylidenepentaerythritol, triallyl cyanurate, triallyl isocyanurate, 1,2,4-trivinylcyclohexane, divinylbenzenes (purity 50 to 100%, preferably 80 to 100%), divinylbiphenyl, 1,3-diisopropenylbenzene, 1,4-diisopropenylbenzene, and oligomers thereof, 1,2-polybutadiene (1,2 content 10 to 100%, preferably 50 to 100%), novolak phenol allyl ether, allylated poly (phenylene oxide),

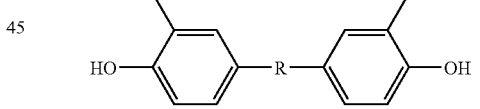

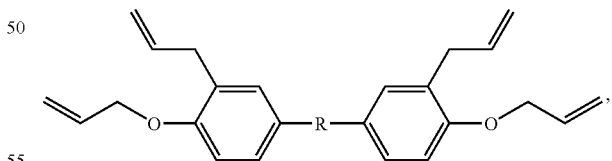

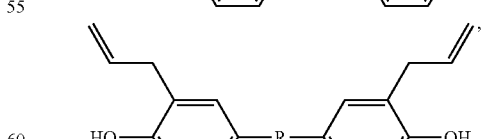

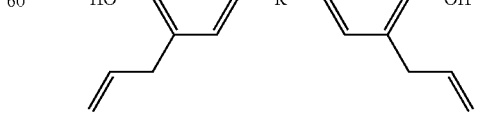

(R representing a bivalent group selected from among

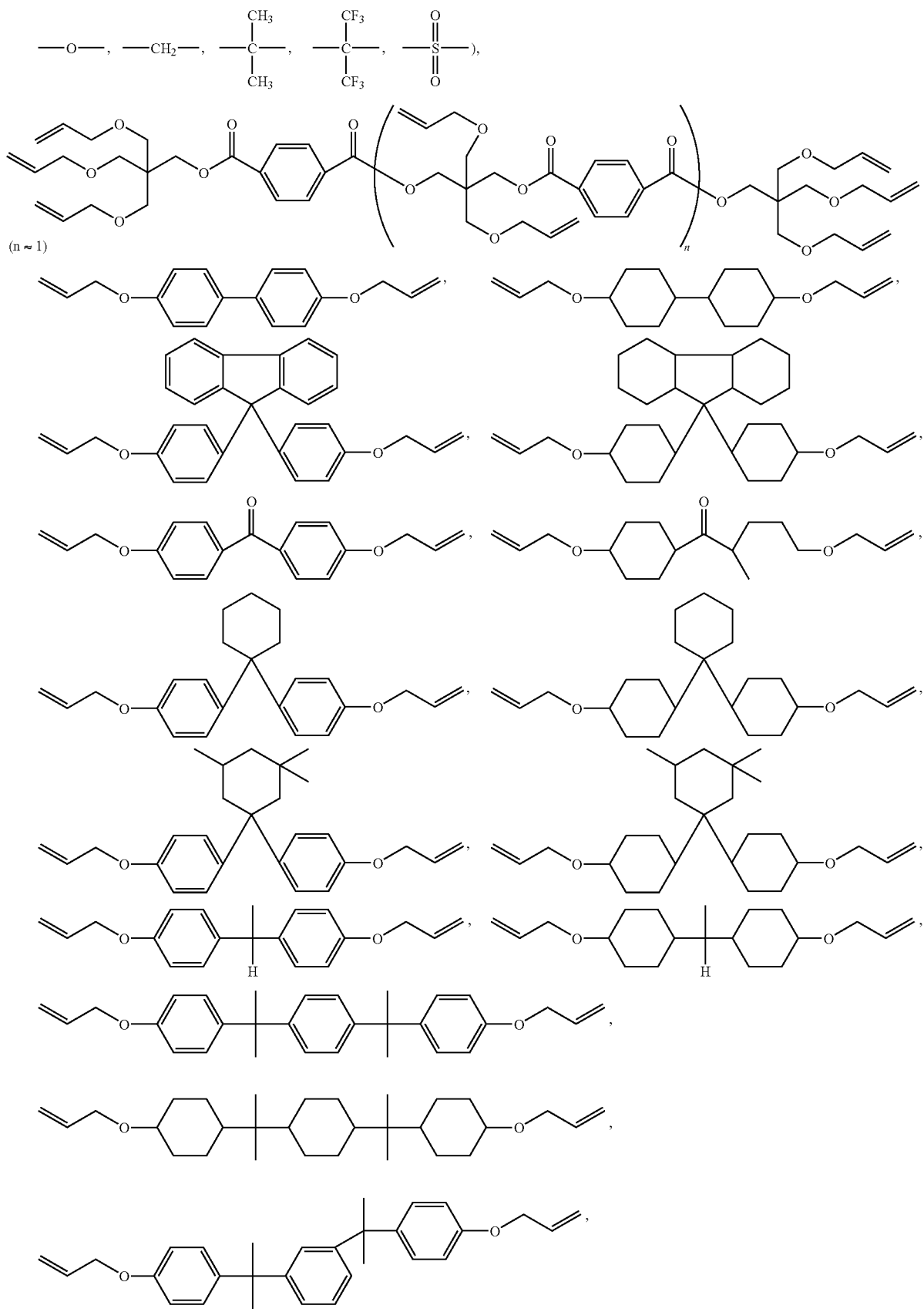

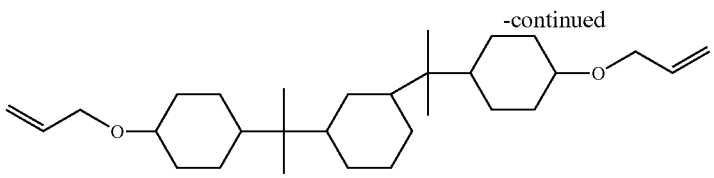

and, further, products derived from conventional epoxy resins by allyl group substitution for part or all of the glycidyl groups of the resins.

Also usable as the component (A) are low-molecular-weight compounds which can hardly be expressed dividedly in terms of a skeletal portion and an alkenyl group, as mentioned above. As specific examples of such low-molecular-weight compounds, there may be mentioned aliphatic linear polyene compounds such as butadiene, isoprene, octadiene and decadiene, alicyclic polyene compounds such as cyclopentadiene, cyclohexadiene, cyclooctadiene, dicyclopentadiene, tricyclopentadiene and norbornadiene, substituted alicyclic olefin compounds such as vinylcyclopentene and vinylcyclohexene, etc.

From the viewpoint of the possibility of achieving further improvements in heat resistance, it is preferred that the component (A) contain the carbon-carbon double bonds reactive with a SiH group in an amount of not less than 0.001 mole, more preferably not less than 0.005 mole, still more preferably not less than 0.008 mole, per gram of component (A).

As for the number of carbon-carbon double bonds reactive with a SiH group in component (A), it is only required that the number be at least 2 per molecule on average. For achieving further improvements in mechanical strength, the number is preferably more than 2, more preferably not less than 3. If the number of carbon-carbon double bonds reactive with a SiH group in component (A) is 1 or less per molecule, the component (A), upon reacting with the component (B), will only give a graft structure but will fail to give a crosslinked structure.

From the good reactivity viewpoint, the component (A) preferably contains at least one vinyl group, more preferably two or more vinyl groups, in each molecule. From the viewpoint of tendency toward better storage stability, it preferably contains not more than 6 vinyl groups, more preferably not more than 4 vinyl groups, in each molecule.

From the viewpoint of high mechanical heat resistance and from the viewpoint of less stringiness and good moldability, handleability and applicability, the component (A) preferably has a molecular weight lower than 900, more preferably lower than 700, still more preferably lower than 500. From the viewpoint of lower volatility and good handleability, the molecular weight is preferably not lower than 100, more preferably not lower than 150. The molecular weight can be determined by means of a gas chromatograph-mass spectrometer or liquid chromatograph-mass spectrometer, for instance.

For attaining uniform admixture with other components and good workability, the component (A) preferably has a viscosity at 23° C. of lower than 1,000 poises, more preferably lower than 300 poises, still more preferably lower than 30 poises. The lower limit is preferably not lower than 0.05 poise, more preferably not lower than 0.1 poise. The viscosity can be determined using an E type viscometer.

From the viewpoint of inhibition of discoloration, in particular yellowing, the component (A) is preferably low in content of a compound having a phenolic hydroxyl group and/or a group derived from a phenolic hydroxyl group and, more preferably, it is free of any compound having a phenolic hydroxyl group and/or a group derived from a phenolic hydroxyl group. The term "phenolic hydroxyl group" so referred to herein means a hydroxyl group directly bound to an aromatic hydrocarbon moiety, for example a benzene, naphthalene or anthracene ring, and the "group derived from a phenolic hydroxyl group" means a group resulting from substitution of an alkyl (e.g. methyl, ethyl, etc.), alkenyl (e.g. vinyl, allyl, etc.), acyl (e.g. acetoxyl, etc.) group for the hydrogen atom of the above phenolic hydroxyl group.

Preferred as the component (A) from the viewpoint of less discoloration and high light resistance of the light-shielding resin obtained are vinylcyclohexene, dicyclopentadiene, triallyl isocyanurate, 2,2-bis(4-hydroxycyclohexyl)propane diallyl ether, and 1,2,4-trivinylcyclohexane. Particularly preferred are triallyl isocyanurate, 2,2-bis(4-hydroxycyclohexyl)propane diallyl ether, and 1,2,4-trivinylcyclohexane.

For reducing the viscosity of the curable composition to be obtained, vinylcyclohexene, divinylbenzene, 1,2,4-trivinylcyclohexane, and triallyl isocyanurate are particularly preferred.

The component (A) may have another reactive group. In that case, such reactive group includes the following groups: epoxy, amino, radical-polymerizable unsaturated group, carboxyl, isocyanato, hydroxyl, alkoxysilyl group and so on. In cases where the component (A) has such a functional group as recited above, the curable composition obtained tends to show increased adhesive properties and the strength of the resulting curing product tends to become high. An epoxy group is preferred among those functional groups in view of the tendency for the resulting curable composition to have better adhesive properties. In view of the tendency for the resulting curing product to become higher in heat resistance, it is preferred that the component (A) has not less than one such reactive group per molecule on average.

From the high heat resistance and light resistance viewpoint, the component (A) preferably contains an organic compound represented by the following general formula (I):

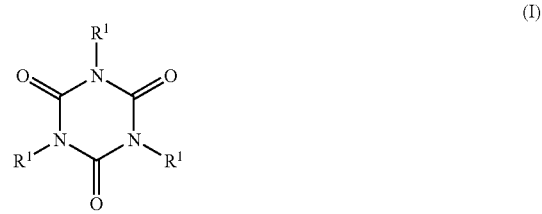

wherein each $R^1$ represents a univalent organic group containing 1 to 50 carbon atoms and the three $R^1$ groups may be the same or different.

From the viewpoint that the curing product obtained can have higher heat resistance, the group $R^1$ in the above general formula (I) is preferably a univalent organic group containing 1 to 20 carbon atoms, more preferably a univalent organic group containing 1 to 10 carbon atoms, still more preferably a univalent organic group containing 1 to 4 carbon atoms. As preferred examples of $R^1$, there may be mentioned methyl, ethyl, propyl, butyl, phenyl, benzyl, phenethyl, vinyl, allyl, glycidyl,

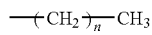

(n being a number of 4 to 19),

(n being a number of 2 to 18),

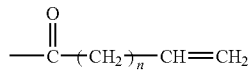

(n being a number of 0 to 17),

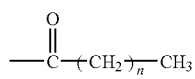

(n being a number of 0 to 19),

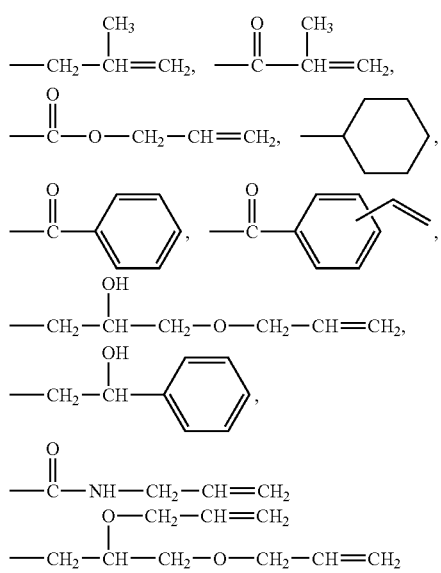

and the like.

Referring to $R^1$ in the above general formula (I), at least one of the three $R^1$ groups is preferably a univalent organic group containing 1 to 50 carbon atoms and containing one or more epoxy groups, more preferably a univalent organic group containing 1 to 50 carbon atoms and containing one or more epoxy groups represented by the formula:

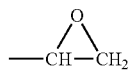

from the viewpoint that the curing product to be obtained can be improved in adhesion to various materials. As preferred examples of such $R^1$, there may be mentioned glycidyl,

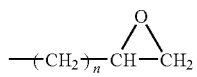

(n being a number of 2 to 18),

and the like.

From the viewpoint that the curing product to be obtained can be improved in chemical heat resistance, at least one of the $R^1$ groups in the above general formula (I) is preferably a univalent organic group containing 1 to 50 carbon atoms and containing no or at most two oxygen atoms and comprising C, H, N and/or O, as exclusive constituent elements, more preferably a univalent hydrocarbon group containing 1 to 50 carbon atoms. As preferred examples of such R', there may be mentioned methyl, ethyl, propyl, butyl, phenyl, benzyl, phenethyl, vinyl, allyl, glycidyl,

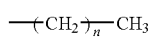

(n being a number of 4 to 19),

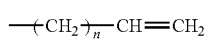

(n being a number of 2 to 18),

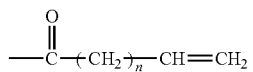

(n being a number of 0 to 17),

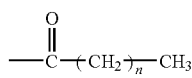

(n being a number of 0 to 19),

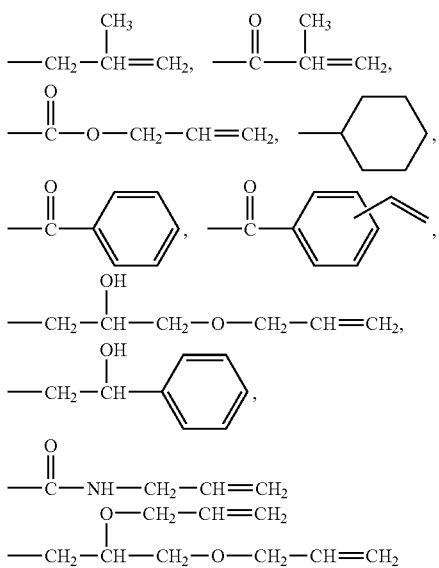

and the like.

From the better reactivity viewpoint, at least one of the $R^1$ groups in the above general formula (I) is preferably a univalent organic group containing 1 to 50 carbon atoms and containing one or more groups represented by the formula:

More preferably, at least one $R^1$ group is a univalent organic group containing 1 to 50 carbon atoms and containing one or more groups represented by the following general formula (IV):

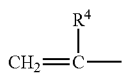

(IV)

wherein $R^4$ represents a hydrogen atom or a methyl group. Still more preferably, at least two of the three $R^1$ groups are organic groups each represented by the following general formula (V):

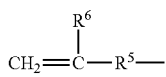

(V)

wherein $R^5$ represents a direct bond or a bivalent organic group containing 1 to 48 carbon atoms and $R^6$ represents a hydrogen atom or a methyl group (the plurality each of $R^5$ and $R^6$ groups may be the same or different).

From the viewpoint that the curing product obtained can be higher in heat resistance, $R^5$ in the above general formula (V), which may be a direct bond or a bivalent organic group containing 1 to 48 carbon atoms, is preferably a direct bond or a bivalent organic group containing 1 to 20 carbon atoms, more preferably a direct bond or a bivalent organic group containing 1 to 10 carbon atoms, still more preferably a direct bond or a bivalent organic group containing 1 to 4 carbon atoms. As examples of $R^5$ in such preferred cases, there may be mentioned

(n being a number of 0 to 17),

(n being a number of 0 to 16),

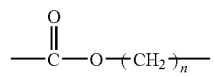

(n being a number of 0 to 16),

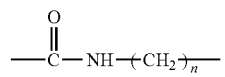

(n being a number of 0 to 16),

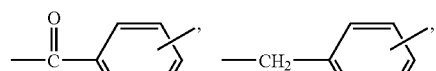

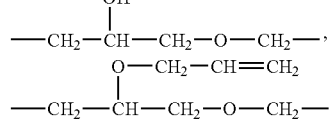

and the like.

From the viewpoint that the curing product obtained can be improved in chemical heat stability, $R^5$ in the above general formula (V) is preferably a direct bond or a bivalent organic group containing 1 to 48 carbon atoms and containing not more than two oxygen atoms and containing C, H and/or O, as exclusive constituent elements, more preferably a direct bond or a bivalent hydrocarbon group containing 1 to 48 carbon atoms. As examples of $R^5$ in such preferred cases, there may be mentioned

(n being a number of 1 to 17),

(n being a number of 1 to 16),

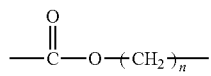

(n being a number of 1 to 16),

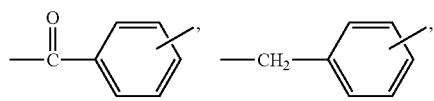

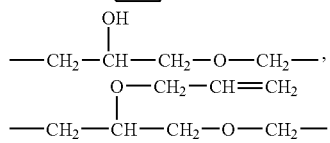

and the like.

From the better reactivity viewpoint, $R^6$ in the above general formula (V), which may be a hydrogen atom or a methyl group, is preferably a hydrogen atom.

Even in such preferable examples of the organic compound of general formula (I) as mentioned above, however, it is necessary that there are at least two carbon-carbon double bonds reactive with a SiH group in each molecule. From the viewpoint of the possibility of further improvements in heat resistance, the compound of general formula (I) is more preferably an organic compound containing three or more carbon-carbon double bonds reactive with a SiH group in each molecule.

As preferred specific examples of such organic compound represented by the general formula (I), there may be mentioned triallyl isocyanurate,

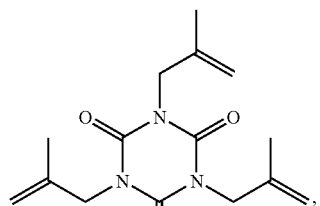

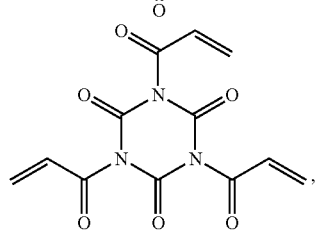

-continued

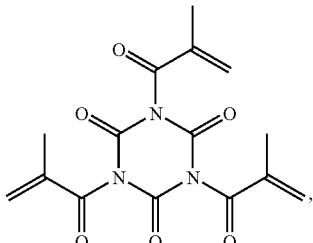

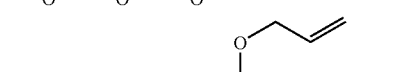

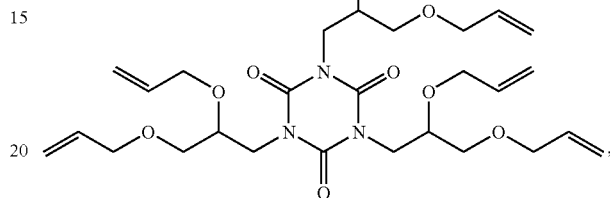

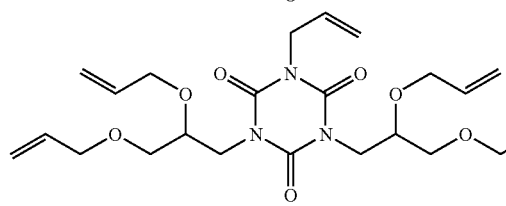

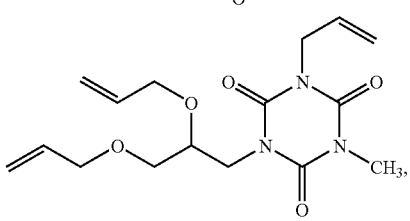

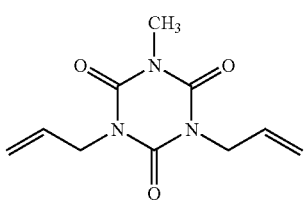

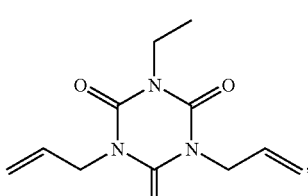

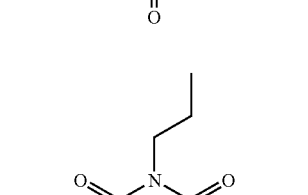

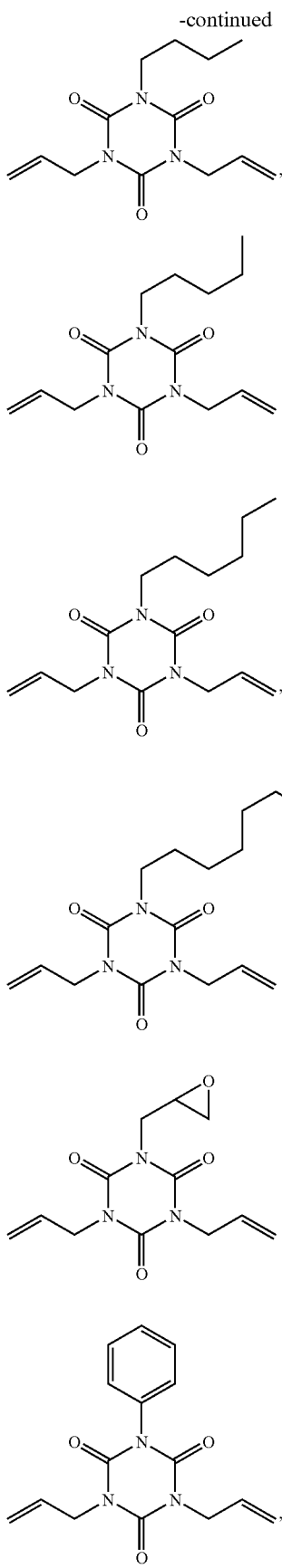

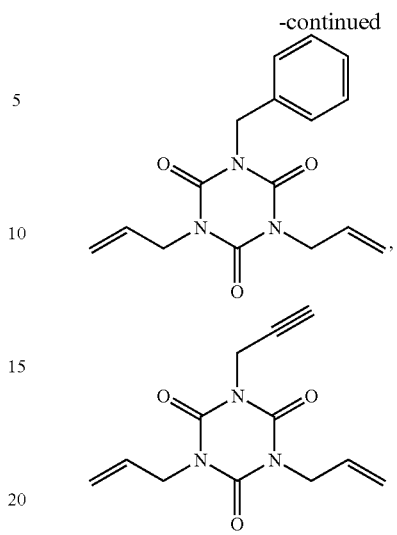

and the like.

For reducing the viscosity of the curable composition to be obtained, triallyl isocyanurate is preferred.

For improving the adhesive properties of the light-shielding resin, diallyl monoglycidyl isocyanurate is preferred as the compound (A).

For attaining a proper balance between the adhesive properties and light resistance of the light-shielding resin, a mixture of triallyl isocyanurate and diallyl monoglycidyl isocyanurate is preferred as the component (A). That mixture is effective from the heat resistance viewpoint as well since it has an isocyanurate ring skeleton. The mixing ratio can be optionally selected. For achieving the above object, the triallyl isocyanurate/diallyl monoglycidyl isocyanurate mole ratio is preferably 9/1 to 1/9, more preferably 8/2 to 2/8, most preferably 7/3 to 3/7.

The component (A) may contain one single species or a mixture of two or more species.

An explanation is now made of the component (B).

The component (B) of the invention is a compound containing at least two SiH groups in each molecule.

The component (B) may be any compound containing at least two SiH groups in each molecular, without any other restriction. Thus, for example, those compounds which are described in International Laid-open Patent Application WO 96/15194 and have at least two SiH groups in each molecular and the like can be used.

Among these, linear and/or cyclic organopolysiloxanes having at least two SiH groups in each molecule are preferred from the availability viewpoint. More specifically, there may be mentioned:

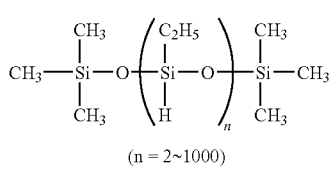

(n = 2~1000)

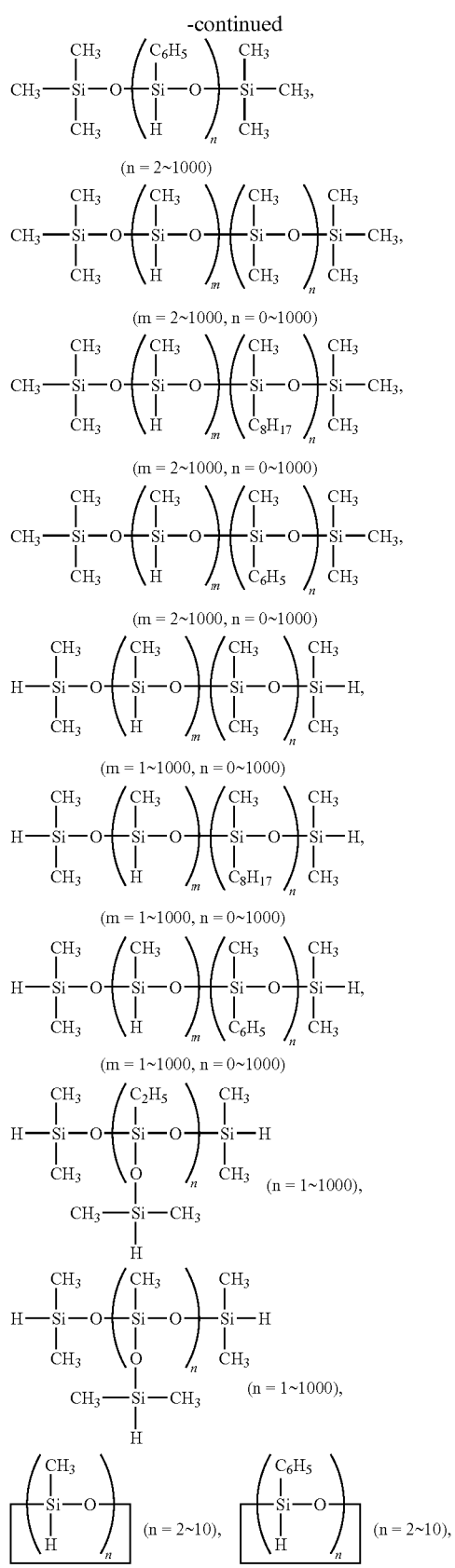

and the like.

From the viewpoint of compatibility with the component (A), those cyclic organopolysiloxanes having at least two SiH groups in each molecule which are represented by the following general formula (VI):

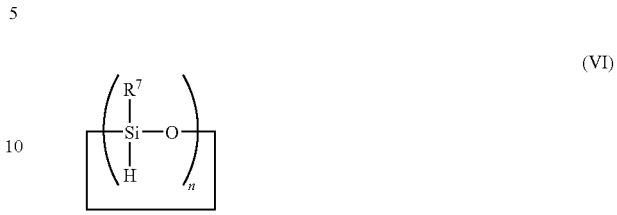

wherein $R^7$ represents an organic group containing 1 to 6 carbon atoms and n represents a number of 2 to 10, are more preferred.

The substituent $R^7$ in the compounds represented by the general formula (VI) is preferably an organic group containing 1 to 6 carbon atoms and constituted of C, H and/or O, more preferably a hydrocarbon group containing 1 to 6 carbon atoms, still more preferably a methyl group.

From the ready availability viewpoint, 1,3,5,7-tetramethylcyclotetrasiloxane is preferred as the compound represented by the general formula (VI).

The molecular weight of the component (B) is not particularly restricted but may be optionally selected. From the viewpoint that the fluidity of the curable composition can be manifested more easily, low molecular weights are preferred. In this case, the lower limit to the molecular weight is preferably 50, and the upper limit thereto is preferably 100,000, more preferably 1,000, still more preferably 700.

The component (B) to be used may contain one single species or a mixture of two or more species.

Further, from the viewpoint of good compatibility with the component (A) and from the viewpoint that the component (B) is low in volatility and the problem of outgassing from the resulting composition hardly occurs, those compounds which can be obtained by subjecting an organic compound (α) having one or more carbon-carbon double bonds reactive with a SiH group in each molecule and a linear and/or cyclic polyorganosiloxane (β) having at least two SiH groups in each molecule to hydrosilylation reaction are preferred as the component (B).

(Component (α))

Usable here as the component (α) are the same organic compounds (α1) as those which have at least two carbon-carbon double bonds reactive with a SiH group in each molecule and are to serve as the component (A) mentioned above. The use of such component (α1) tends to result in a high crosslink density and high mechanical strength of the curing product.

In addition, an organic compound (α2) having one carbon-carbon double bond reactive with a SiH group in each molecule can also be used. The use of the component (α2) tends to render the curing product low in elasticity.

(Component (α2))

The component (α2) is not particularly restricted but may be any organic compound having one carbon-carbon double bond reactive with a SiH group in each molecule. From the viewpoint of better compatibility between component (B) and component (A), however, it is preferably one containing C, H, N, O, S and halogen, as exclusive constituent elements, not a polysiloxane-organic block copolymer, a polysiloxane-organic graft copolymer or a like siloxane unit (Si—O—Si)-containing one.

The sites of occurrence of the carbon-carbon double bonds reactive with a SiH group in component (α2) are not particularly restricted but may be anywhere within the molecule.

The component (α2) compound may be classified as a polymer type compound or as a monomer type compound.

Usable as the polymer type compound are, for example, polysiloxane type, polyether type, polyester type, polyarylate type, polycarbonate type, saturated hydrocarbon type, unsaturated hydrocarbon type, polyacrylic ester type, polyamide type, phenol-formaldehyde type (phenol resin type), polyimide type compounds, etc.

The monomer type compound includes, for example, phenol type, bisphenol type, benzene, naphthalene or like aromatic hydrocarbon type compounds; aliphatic (e.g. straight chain, alicyclic, etc.) hydrocarbon type compounds; heterocyclic type compounds; silicon compounds; mixtures of these; etc.

The carbon-carbon double bonds reactive with a SiH group in component (α2) are not particularly restricted but, from the reactivity viewpoint, those groups represented by the following general formula (II):

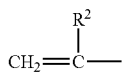
(II)

wherein $R^2$ represents a hydrogen atom or a methyl group, are preferred. From the material availability viewpoint, the group represented by

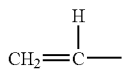

is particularly preferred.

Preferred as the carbon-carbon double bonds reactive with a SiH group in component (α2) are alicyclic groups having a partial structure represented by the following general formula (III):

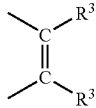
(III)

wherein each $R^3$ represents a hydrogen atom or a methyl group and the two $R^3$ groups may be the same or different, in the ring structure, since high heat resistance can be given to curing products. From the material availability viewpoint, alicyclic groups having a partial structure represented by the following formula

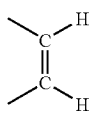

in the ring structure are preferred.

The carbon-carbon double bonds reactive with a SiH group each may be directly bonded to the skeletal portion of component (α2) or covalently bonded thereto via a bivalent or polyvalent substituent.

The bivalent or polyvalent substituent is not particularly restricted but may be any substituent containing 0 to 10 carbon atoms. From the viewpoint of better compatibility between component (B) and component (A), however, one containing C, H, N, O, S and halogen, as exclusive constituent elements is preferred. Examples of such substituent are:

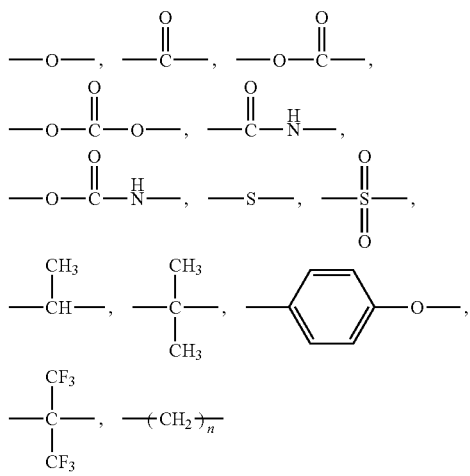

(n representing a number of 1 to 10),

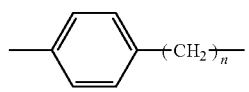

(n representing a number of 0 to 4), and

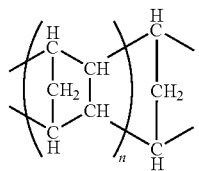

(n representing a number of 0 to 4), etc. Two or more of these bivalent or polyvalent substituents may be covalently bonded together to form one bivalent or polyvalent substituent.

As examples of such group covalently bonded to the skeletal portion, there may be mentioned vinyl, allyl, methallyl, acryl, methacryl, 2-hydroxy-3-(allyloxy)propyl, 2-allylphenyl, 3-allylphenyl, 4-allylphenyl, 2-(allyloxy)phenyl, 3-(allyloxy)phenyl, 4-(allyloxy)phenyl, 2-(allyloxy)ethyl, 2,2-bis(allyloxymethyl)butyl, 3-allyloxy-2,2-bis(allyloxymethyl)propyl,

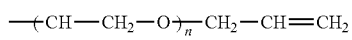

(n representing a number satisfying the relation $5 \geqq n \geqq 2$),

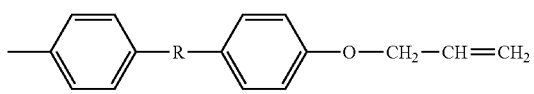

(R representing a bivalent group selected from among

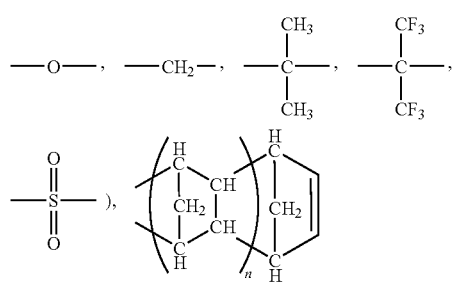

(n representing a number of 0 to 4), and the like.

As specific examples of the component (α2), there may be mentioned linear aliphatic hydrocarbon compounds such as propene, 1-butene, 1-pentene, 1-hexene, 1-heptene, 1-octene, 1-nonene, 1-decene, 1-dodecene, 1-undecene, Idemitsu Petrochemical's Linealene, 4,4-dimethyl-1-pentene, 2-methyl-1-hexene, 2,3,3-trimethyl-1-butene and 2,4,4-trimethyl-1-pentene; alicyclic hydrocarbon compounds such as cyclohexene, methylcyclohexene, methylenecyclohexane, norbornylene, ethylidenecyclohexane, vinylcyclohexane, camphene, carene, α-pinene and β-pinene; aromatic hydrocarbon compounds such as styrene, α-methylstyrene, indene, allylbenzene and 4-phenyl-1-butene; allyl ethers such as alkyl allyl ethers and allyl phenyl ether; aliphatic compounds such as glycerol monoallyl ether, ethylene glycol monoallyl ether and 4-vinyl-1,3-dioxolan-2-one; aromatic compounds such as 1,2-dimethoxy-4-allylbenzene and o-allylphenol; substituted isocyanurates such as monoallyl dibenzyl isocyanurate and monoallyl diglycidyl isocyanurate; silicon compounds such as vinyltrimethylsilane, vinyltrimethoxysilane and vinyltriphenylsilane; etc. There may further be mentioned polymers and oligomers having a vinyl group at one end, for example polyether resins such as polyethylene oxide allylated at one end and polypropylene oxide allylated at one end; hydrocarbon resins such as polyisobutylene allylated at one end; acrylic resins such as poly(butyl acrylate) allylated at one end and poly(methyl methacrylate) allylated at one end; etc.

The structure may be linear or branched. The molecular weight is not particularly restricted but may be at any of various levels. The molecular weight distribution is not particularly restricted, either, but may be diverse. From the viewpoint that the mixture viscosity tends to become low and the moldability tends to become better, however, the molecular weight distribution is preferably not more than 3, more preferably not more than 2, still more preferably not more than 1.5.

The glass transition temperature of the component (α2), if any, is not particularly restricted, either, but may be diverse. In view of the tendency for the curing product obtained to become tough, however, the glass transition temperature is preferably not higher than 100° C., more preferably not higher than 50° C., still more preferably not higher than 0° C.

As preferred examples of the resin, there may be mentioned poly(butyl acrylate) resins and the like. Conversely, in view of the tendency for the curing product obtained to become highly resistant to heat, the glass transition temperature is preferably not lower than 100° C., more preferably not lower than 120° C., still more preferably not lower than 150° C., most preferably not lower than 170° C. The glass transition temperature can be determined by dynamic viscoelasticity measurement and expressed in terms of the temperature at which a maximum tan δ value is obtained.

In view of the tendency for the curing product obtained to become high in heat resistance, the component (α2) is preferably a hydrocarbon compound. In this case, the lower limit to the number of carbon atoms is 7, and a preferred upper limit thereto is 10.

The component (α2) may have another reactive group. In that case, such reactive group includes the following groups: epoxy, amino, radical-polymerizable unsaturated group, carboxyl, isocyanato, hydroxyl, alkoxysilyl group and so on. In cases where the above component has such a functional group as recited above, the adhesive properties of the curable composition obtained tends to become higher and the strength of the curing product obtained tends to become high. From the higher adhesive properties viewpoint, an epoxy group is preferred among those functional groups. In view of the tendency for the resulting curing product to have a higher level of heat resistance, it is preferred that the above component have not less than one such reactive group per molecule on average. As specific examples, there may be mentioned monoallyl diglycidyl isocyanurate, allyl glycidyl ether, allyloxyethyl methacrylate, allyloxyethyl acrylate, vinyltrimethoxysilane, etc.

Such components (α2) as mentioned above may be used singly or in combination of a plurality thereof.

(Component (β))

The component (β) is a linear and/or cyclic polyorganosiloxane having at least two SiH groups in each molecule.

Specifically, there may be mentioned:

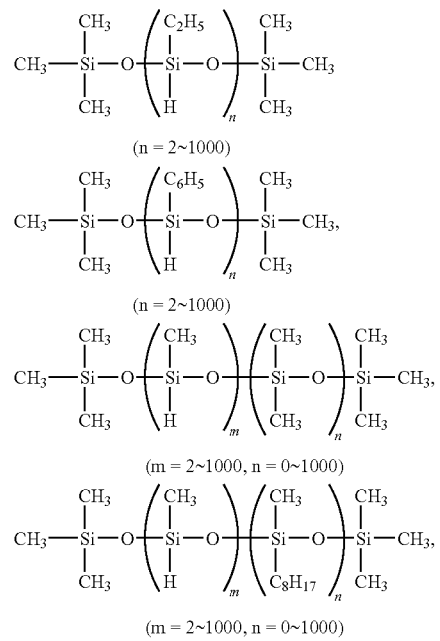

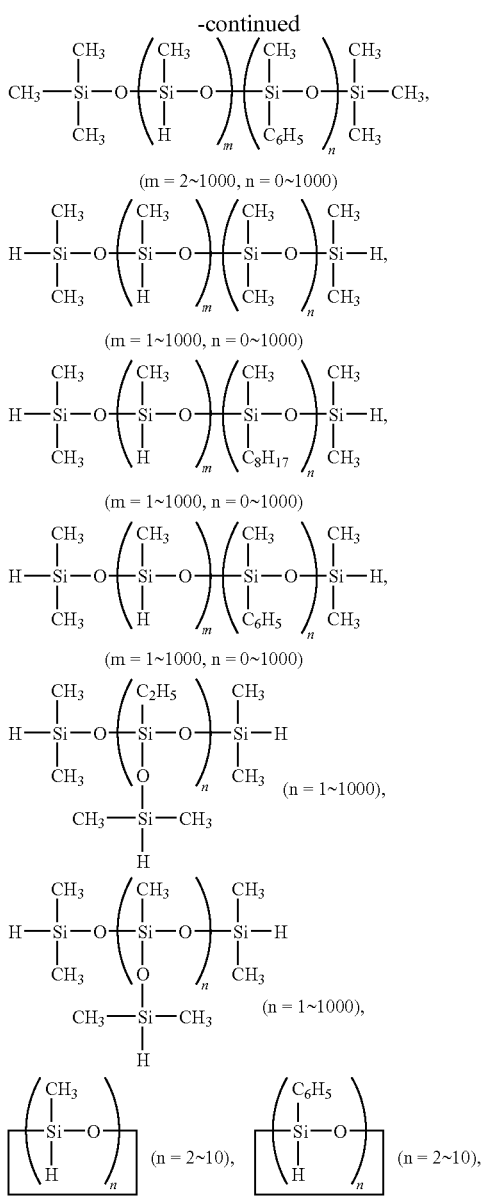

and the like.

From the viewpoint that the compatibility with component (α) tends to become better, those cyclic polyorganosiloxanes having at least three SiH groups in each molecule which are represented by the following general formula (VI):

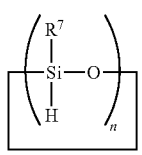

(VI)

wherein $R^7$ represents an organic group containing 1 to 6 carbon atoms and n represents a number of 3 to 10, are preferred.

The substituent $R^7$ in the compounds represented by the general formula (VI) is preferably an organic group containing 1 to 6 carbon atoms and constituted of C, H and/or O, more preferably a hydrocarbon group containing 1 to 6 carbon atoms, still more preferably a methyl group.

From the ready availability viewpoint, etc., 1,3,5,7-tetramethylcyclotetrasiloxane is preferred.

Such various components (β) as mentioned above may be used singly or as a mixture of two or more of them.

(Reaction Between Component (α) and Component (β))

An explanation is now made of the hydrosilylation reaction between the component (α) and component (β), which is to be carried out in preparing a compound resulting from hydrosilylation reaction between component (α) and component (β) for use as the component (B) of the invention.

The hydrosilylation reaction of component (α) and component (β) may give a mixture of a plurality of compounds, including the component (B) of the invention in some instances. It is also possible to use the mixture as such in preparing the curable composition of the invention, without separating the component (B).

The mixing ratio between component (α) and component (β) in carrying out the hydrosilylation reaction between component (α) and component (β) is not particularly restricted but, when the strength of the curing product resulting from hydrosilylation of the component (A) with the component (B) obtained is taken into consideration, a higher SiH group content in the component (B) is preferred, so that the ratio of the total number (X) of carbon-carbon double bonds reactive with a SiH group as occurring in the component (α) to be admixed and the total number (Y) of SiH groups in the component (β) to be admixed is preferably such that it is not less than 2 (Y/X≧2), more preferably such that it is not less than 3 (Y/X≧3). From the viewpoint that the compatibility of the component (B) with the component (A) tends to become better, it is preferred that the ratio satisfied the relation 10≧Y/X, more preferably 5≧Y/X.

In subjecting the component (α) and component (β) to hydrosilylation reaction, an appropriate catalyst may be used. Useful as the catalyst are, for example, such hydrosilylation catalysts as the following ones. There may be mentioned simple substance platinum, solid platinum supported on such a carrier as alumina, silica or carbon black, chloroplatinic acid, complexes of chloroplatinic acid with an alcohol, aldehyde, ketone, etc., platinum-olefin complexes (e.g. $Pt(CH_2=CH_2)_2(PPh_3)_2$, $Pt(CH_2=CH_2)_2Cl_2$), platinum-vinylsiloxane complexes (e.g. $Pt(ViMe_2SiOSiMe_2Vi)_n$, $Pt[(MeViSiO)_4]_m$), platinum-phosphine complexes (e.g. $Pt(PPh_3)_4$, $Pt(PBu_3)_4$), platinum-phosphite complexes (e.g. $Pt[P(OPh)_3]_4$, $Pt[P(OBu)_3]_4$) (in the formulas, Me represents a methyl group, Bu a butyl group, Vi a vinyl group and Ph a phenyl group, and n and m each represents an integer), dicarbonyldichloroplatinum, Karstedt catalyst, platinum-hydrocarbon complexes described in Ashby's U.S. Pat. Nos. 3,159,601 and 3,159,662, platinum-alcoholate catalysts described in Lamoreaux's U.S. Pat. No. 3,220,972, and so on. Furthermore, platinum chloride-olefin complexes described in Modic's U.S. Pat. No. 3,516,946 are also useful in the practice of the present invention.

As catalysts other than platinum compounds, there may be mentioned, for example, $RhCl(PPh_3)_3$, $RhCl_3$, $RhAl_2O_3$, $RuCl_3$, $IrCl_3$, $FeCl_3$, $AlCl_3$, $PdCl_2 \cdot 2H_2O$, $NiCl_2$, $TiCl_4$, etc.

Among these, chloroplatinic acid, platinum-olefin complexes, platinum-vinylsiloxane complexes and the like are preferred from the catalytic activity viewpoint. These catalysts may be used singly or in combination of two or more.

The level of addition of the catalyst is not particularly restricted but, for attaining a sufficient level of curability and reducing the cost of the curable composition to a relatively low level, the lower limit to the addition level is preferably $10^{-8}$ mole, more preferably $10^{-6}$ mole, per mole of the SiH group in component (β), and the upper limit to the addition level is preferably $10^{-1}$ mole, more preferably $10^{-2}$ mole, per mole of the SiH group in component (β).

A promoter may be used in combination with the above catalyst. As the promoter, there may be mentioned, for example, phosphorus compounds such as triphenylphosphine; 1,2-diester compounds such as dimethyl maleate; acetylene alcohol compounds such as 2-hydroxy-2-methyl-1-butyne; sulfur compounds inclusive of simple substance sulfur; amine compounds such as triethylamine; etc.

The level of addition of the promoter is not particularly restricted but the lower limit to the addition level is preferably $10^{-2}$ mole, more preferably $10^{-1}$ mole, and the upper limit is $10^2$ mole, more preferably 10 moles, per mole of the hydrosilylation catalyst.

As for the method of mixing up the component (α), component (β) and catalyst in carrying out the reaction, various methods may be employed. Preferred is, however, the method comprising mixing the component (α) with the catalyst and mixing the resulting mixture with the component (β). The method comprising mixing the catalyst with a mixture of the component (α) and component (β) makes it difficult to control the reaction.

When the method comprising mixing the component (α) with a mixture of the component (β) and catalyst is employed, the component (β), which is reactive with moisture possibly contained therein in the presence of the catalyst, may cause denaturation in some instances.

The reaction temperature may be selected at various levels. In the instance case, the lower limit to the reaction temperature is preferably 30° C., more preferably 50° C., and the upper limit to the reaction temperature is preferably 200° C., more preferably 150° C. At lower reaction temperatures, the reaction time for the reaction to proceed to a satisfactory extent becomes long whereas higher reaction temperatures are not practical. The reaction may be carried out at a constant temperature, or the temperature may be varied stepwise or continuously according to need.

The reaction time and the pressure during reaction may also be selected at various levels according to need.

A solvent may be used in the hydrosilylation reaction. The solvent to be used is not particularly restricted but any of those which will not inhibit the hydrosilylation reaction. Specifically, hydrocarbon solvents such as benzene, toluene, hexane and heptane; ether solvents such as tetrahydrofuran, 1,4-dioxane, 1,3-dioxolane and diethyl ether; ketone solvents such as acetone and methyl ethyl ketone; and halogenated solvents such as chloroform, methylene chloride and 1,2-dichloroethane can be used satisfactorily. Such solvents can be used either singly or in the form of a mixed solvent composed of two or more species. Preferred as the solvent are toluene, tetrahydrofuran, 1,3-dioxolane and chloroform. The amount of the solvent to be used can be adequately selected.

Further, various additives may be used for the purpose of controlling the reactivity, etc.

It is also possible, after reacting the component (α) with the component (β), to remove the solvent and/or unreacted component (α) and/or unreacted component (β). When these volatile components are removed, the component (B) obtained becomes free of such volatile components and, therefore, the problems of void formation and cracking due to volatile matter evaporation in the step of curing with the component (A) will hardly occur. The method of removal includes, for example, volatile matter removal under reduced pressure and, further, treatment with active carbon, aluminum silicate, silica gel or the like. In the case of volatile matter removal under reduced pressure, the treatment is preferably carried out at low temperatures. In this case, the upper limit to the temperature is preferably 100° C., more preferably 60° C. High temperature treatment tends to be accompanied by changes in properties, for example viscosity increase.

As examples of such component (B), namely the reaction product from the components (α) and (β), there may be mentioned the divinylbenzene-1,3,5,7-tetramethylcyclotetrasiloxane reaction product, bisphenol A diallyl ether-1,3,5,7-tetramethylcyclotetrasiloxane reaction product, vinylcyclohexene-1,3,5,7-tetramethylcyclotetrasiloxane reaction product, dicyclopentadiene-1,3,5,7-tetramethylcyclotetrasiloxane reaction product, triallyl isocyanurate-1,3,5,7-tetramethylcyclotetrasiloxane reaction product, diallyl monoglycidyl isocyanurate-1,3,5,7-tetramethylcyclotetrasiloxane reaction product, allyl glycidyl ether-1,3,5,7-tetramethylcyclotetrasiloxane reaction product, (α)-methylstyrene-1,3,5,7-tetramethylcyclotetrasiloxane reaction product, monoallyl diglycidyl isocyanurate-1,3,5,7-tetramethylcyclotetrasiloxane reaction product, etc.

For rendering the curable composition low in viscosity, the divinylbenzene-1,3,5,7-tetramethylcyclotetrasiloxane reaction product and α-methylstyrene-1,3,5,7-tetramethylcyclotetrasiloxane reaction product are preferred.

From the viewpoint of the heat resistance and light resistance of the resin resulting from curing of the curable composition, the divinylbenzene-1,3,5,7-tetramethylcyclotetrasiloxane reaction product and triallyl isocyanurate-1,3,5,7-tetramethylcyclotetrasiloxane reaction product are preferred. From the heat resistance, light resistance and/or adhesive properties viewpoint, the diallyl monoglycidyl isocyanurate-1,3,5,7-tetramethylcyclotetrasiloxane reaction product and monoallyl diglycidyl isocyanurate-1,3,5,7-tetramethylcyclotetrasiloxane reaction product are preferred.

The hydrosilylation catalyst, which is the component (C) of the present invention is now explained.

The hydrosilylation catalyst is not particularly restricted but may be any one having catalytic activity in the hydrosilylation reaction. Thus, there may be mentioned, for example, simple substance platinum, solid platinum supported on such a carrier as alumina, silica or carbon black, chloroplatinic acid, complexes of chloroplatinic acid with an alcohol, aldehyde, ketone, etc., platinum-olefin complexes (e.g. $Pt(CH_2=CH_2)_2(PPh_3)_2$, $Pt(CH_2=CH_2)_2Cl_2$) platinum-vinylsiloxane complexes (e.g. $Pt(ViMe_2SiOSiMe_2Vi)_n$, $Pt[(MeViSiO)_4]_m$), platinum-phosphine complexes (e.g. $Pt(PPh_3)_4$, $Pt(PBu_3)_4$), platinum-phosphite complexes (e.g. $Pt[P(OPh)_3]_4$, $Pt[P(OBu)_3]_4$) (in the formulas, Me represents a methyl group, Bu a butyl group, Vi a vinyl group and Ph a phenyl group, and n and m each represents an integer), dicarbonyldichloroplatinum, Karstedt catalyst, platinum-hydrocarbon complexes described in Ashby's U.S. Pat. Nos. 3,159,601 and 3,159,662, platinum-alcoholate catalysts described in Lamoreaux's U.S. Pat. No. 3,220,972, and so on. Furthermore, platinum chloride-olefin complexes described in Modic's U.S. Pat. No. 3,516,946 are also useful in the practice of the present invention.

As catalysts other than platinum compounds, there may be mentioned, for example, $RhCl(PPh_3)_3$, $RhCl_3$, $RhAl_2O_3$, $RuCl_3$, $IrCl_3$, $FeCl_3$, $AlCl_3$, $PdCl_2 \cdot 2H_2O$, $NiCl_2$, $TiCl_4$, etc.

Among these, chloroplatinic acid, platinum-olefin complexes, platinum-vinylsiloxane complexes and the like are preferred from the catalytic activity viewpoint. These catalysts may be used singly or in combination of two or more.

The level of addition of the catalyst is not particularly restricted but, for attaining a sufficient level of curability and reducing the cost of the curable composition to a relatively low level, the lower limit to the addition level is preferably $10^{-8}$ mole, more preferably $10^{-6}$ mole, per mole of the SiH group in component (B), and the upper limit to the addition level is preferably $10^{-1}$ mole, more preferably $10^{-2}$ mole, per mole of the SiH group in component (B).

In cases where the residual amount of the hydrosilylation catalyst used in synthesizing the component (B) is still active in causing a sufficient level of curing, catalyst addition is not always necessary but an additional amount may be added for curability adjustment within the above range.

A promoter may be used in combination with the above catalyst. As the promoter, there may be mentioned, for example, phosphorus compounds such as triphenylphosphine; 1,2-diester compounds such as dimethyl maleate; acetylene alcohol compounds such as 2-hydroxy-2-methyl-1-butyne; sulfur compounds inclusive of simple substance sulfur; amine compounds such as triethylamine; etc.

The level of addition of the promoter is not particularly restricted but the lower limit to the addition level is preferably $10^{-2}$ mole, more preferably $10^{-1}$ mole, and the upper limit is $10^2$ mole, more preferably 10 moles, per mole of the hydrosilylation catalyst.

A curing retarder may be used for improving the storage stability of the composition of the invention or for adjusting the reactivity in the hydrosilylation reaction in the course of production. As the curing retarder, there may be mentioned aliphatic unsaturated bond-containing compounds, organophosphorus compounds, organosulfur compounds, nitrogen-containing compounds, tin compounds, organic peroxides, etc. These may also be used in combination.

The aliphatic unsaturated bond-containing compounds include, for example, propargyl alcohols, en-yne compounds, maleic acid esters, etc. The organophosphorus compounds include, for example, triorganophosphines, diorganophosphines, organophosphines, triorganophosphites, etc. The organosulfur compounds include organomercaptans, diorganosulfides, hydrogen sulfide, benzothiazole, thiazole, benzothiazole disulfide, etc. The nitrogen-containing compounds include ammonia, primary to tertiary alkylamines, arylamines, urea, hydrazine, etc. The tin compounds include stannous halide dehydrates, stannous carboxylates, etc. The organic peroxides include di-tert-butyl peroxide, dicumyl peroxide, benzoyl peroxide, tert-butyl perbenzoate, etc.

From the good retarder activity and availability viewpoint, benzothiazole, thiazole, dimethyl maleate, 3-hydroxy-3-methyl-1-butyne, and 1-ethynyl-1-cyclohexanol are preferred among these curing retarders.

The level of addition of the curing retarder can be selected at various levels but the lower limit to the addition level is preferably $10^{-1}$ mole, more preferably 1 mole, and the upper limit to the addition level is preferably $10^3$ moles, more preferably 50 moles, per mole of the hydrosilylation catalyst used.

These curing retarders may be used singly or two or more of them may be used in combination.

Now, the silane coupling agent and/or epoxy group-containing compound, namely the component (D), is described. The component (D) of the invention is essential as a component for rendering, in combination with the component (E) of the invention, the curable composition adhesive to the package resin.

The silane coupling agent is not particularly restricted but may be any of those compounds which have, within the molecule, at least one functional group reactive with an organic group and at least one hydrolyzable silyl group.

The functional group reactive with an organic group is not particularly restricted but at least one functional group selected from among epoxy, methacryl, acryl, isocyanato, isocyanurato, vinyl and carbamato groups is preferred from the handleability viewpoint. From the viewpoint of curability and adhesive properties, epoxy, methacryl and acryl groups are more preferred, epoxy groups are particularly preferred.

Preferred as the hydrolyzable silyl group from the handleability viewpoint are alkoxysilyl groups and, from the reactivity viewpoint, methoxysilyl and ethoxysilyl groups are particularly preferred.

As preferred examples of the silane coupling agent, there may be mentioned epoxy functional group-containing alkoxysilanes such as 3-glycidoxypropyltrimethoxysilane, 3-glycidoxypropyltriethoxysilane, 2-(3,4-epoxycyclohexyl)ethyltrimethoxysilane and 2-(3,4-epoxycyclohexyl)ethyltriethoxysilane; and methacryl or acryl group-containing alkoxysilanes such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane and acryloxymethyltriethoxysilane.

The level of addition of the silane coupling agent can be selected at various levels. However, the lower limit to the addition level is preferably 0.1 part by weight, more preferably 0.5 part by weight, and the upper limit to the addition level is preferably 50 parts by weight, more preferably 25 parts by weight, per 100 parts by weight of [component (A)+component (B)]. At lower addition levels than 0.1 part by weight, the adhesive property-improving effect tends to become unsatisfactory and, at addition levels exceeding 50 parts by weight, the physical properties of the curing product tend to become poor.

The epoxy group-containing compound includes, for example, various epoxy resins. As the epoxy resins, there may be mentioned, for example, novolak phenol-based epoxy resins, biphenyl-based epoxy resins, dicyclopentadiene-based epoxy resins, bisphenol F diglycidyl ether, bisphenol A diglycidyl ether, 2,2'-bis(4-glycidyloxycyclohexyl)propane, 3,4-epoxycyclohexylmethyl-3,4-epoxycyclohexanecarboxylate, vinylcyclohexene dioxide, 2-(3,4-epoxycyclohexyl)-5,5-spiro(3,4-epoxycyclohexane)-1,3-dioxane, bis(3,4-epoxycyclohexyl) adipate, bisglycidyl 1,2-cyclopropanedicarboxylate, triglycidyl isocyanurate, monoallyl diglycidyl isocyanurate, diallyl monoglycidyl isocyanurate, and like epoxy resins as cured with an aliphatic acid anhydride such as hexahydrophthalic anhydride, methylhexahydrophthalic anhydride, trialkyltetrahydrophthalic anhydrides or hydrogenated methylnadic anhydride. These epoxy resins and curing agents may respectively be used singly or in the form of a combination of a plurality of species.

The level of addition of the epoxy group-containing compound can be selected at various levels. However, the lower limit to the addition level is preferably 0.1 part by weight, more preferably 0.5 part by weight, and the upper limit to the addition level is preferably 50 parts by weight, more preferably 25 parts by weight, per 100 parts by weight of [component (A)+component (B)]. At addition levels lower than 0.1 part by weight, the adhesive property-improving effect tends to become unsatisfactory and, at addition levels exceeding 50 parts by weight, the physical properties of the curing product tend to readily become poor.

The silane coupling agents and epoxy group-containing compounds recited above may be used singly or two or more of them may be used in combination.

The silanol condensation catalyst, namely the component (E), is now described. The component (E) of the invention is essential for providing the curable composition with adhesive properties by combined use with the component (D) of the invention.

The silanol condensation catalyst is not particularly restricted but preferably includes organoaluminum compounds, borate esters, titanium compounds and the like. More preferred are organoaluminum compounds and borate esters. From the viewpoint of low degrees of discoloration in the step of curing and at high temperatures, borate esters are preferred.

The level of addition of the silanol condensation catalyst can be selected at various levels. However, the lower limit to the addition level is preferably 0.05 part by weight, more preferably 0.1 part by weight, and the upper limit to the addition level is preferably 50 parts by weight, more preferably 30 parts by weight, per 100 parts by weight of [component (A)+component (B)]. At addition levels lower than 0.05 part by weight, the adhesive property-improving effect tends to become unsatisfactory and, at addition levels exceeding 50 parts by weight, the physical properties of the curing product may tend to be adversely affected in some instances.

The organoaluminum compounds to be used as the silanol condensation catalyst in the practice of the invention can improve and/or stabilize the adhesive properties.

As the organoaluminum compounds useful in the practice of the invention, there may be mentioned aluminum alcoholate compounds such as trimethoxyaluminum, triethoxyaluminum, triisopropoxyaluminum and trinormalpropoxyaluminum; organic acid aluminum salts such as aluminum naphthenate, aluminum stearate, aluminum octylate and aluminum benzoate; and aluminum chelate compounds such as aluminum ethyl acetoacetate diisopropylate, aluminum ethyl acetoacetoacetate diisobutylate, aluminum tris(ethyl acetoacetate), aluminum bis(ethyl acetoacetate) monoacetylacetonate and aluminum tris(acetylacetonate); etc. From the viewpoint of reactivity and/or sticking/adhesion to substrates, aluminum chelate compounds and aluminum alcoholate compounds are preferred, and aluminum chelate compounds are more preferred. From the viewpoint of chemical compatibility with the hydrosilylation curing reaction, aluminum tris(ethyl acetoacetate) is preferred. The organoaluminum compounds recited above may be used singly or two or more of them may be used in combination.

The borate esters used as the silanol condensation catalyst in the practice of the invention can improve and/or stabilize the adhesive properties.

Borate esters represented by the general formula (VII) or (VIII) given below can be appropriately used in the practice of the invention.

$$B(OR^8)_3 \quad (VII)$$

$$B(OCOR^8)_3 \quad (VIII)$$

In each formula, $R^8$ represents an organic group containing 1 to 48 carbon atoms.

As specific and preferred borate esters, there may be mentioned tri-2-ethylhexyl borate, trinormaloctadecyl borate, trinormaloctyl borate, triphenyl borate, trimethylene borate, tris(trimethylsilyl) borate, trinormalbutyl borate, tri-sec-butyl borate, tri-tert-butyl borate, triisopropyl borate, trinormalpropyl borate, triallyl borate, triethyl borate, trimethyl borate, boron methoxyethoxide and the like. Such borate esters may be used single or two or more species may be used in admixture. When two or more species are used in admixture, the mixing may be made in advance or in the step of curable composition preparation.

Preferred are trinormaloctadecyl borate, trinormaloctyl borate, trinormalbutyl borate, triisopropyl borate, trinormalpropyl borate, triethyl borate, and trimethyl borate.

From the availability viewpoint, trimethyl borate, triethyl borate, and trinormalbutyl borate are more preferred, and trimethyl borate is still more preferred.

From the viewpoint of the possibility of volatility suppression in the step of curing, trinormaloctadecyl borate, trinormaloctyl borate, triphenyl borate, trimethylene borate, tris(trimethylsilyl) borate, trinormalbutyl borate, tri-sec-butyl borate, tri-tert-butyl borate, triisopropyl borate, trinormalpropyl borate, triallyl borate, and boron methoxyethoxide are more preferred, and normaltrioctadecyl borate, tri-tert-butyl borate, triphenyl borate, and trinormalbutyl borate are still more preferred.

From the volatility suppression and/or workability viewpoint, trinormalbutyl borate, triisopropyl borate, and trinormalpropyl borate are more preferred, and trinormalbutyl borate is still more preferred.

From the viewpoint of low degrees of discoloration at high temperatures, trimethyl borate and triethyl borate are more preferred, and trimethyl borate is still more preferred.

The titanium compounds used as the silanol condensation catalyst in the practice of the invention can improve and/or stabilize the adhesive properties.

As examples of the titanium compounds to be used in the practice of the invention, there may be mentioned tetraalkoxytitaniums such as tetraisopropoxytitanium and tetrabutoxytitanium; titanium chelates such as titanium tetraacetylacetonate; common titanate coupling agents having such a residue as oxyacetic acid or ethylene glycol; etc. Such titanium compounds may be used singly or two or more of them may be used in combination.

The silane coupling agent and/or epoxy group-containing compound, i.e. the component (D) of the invention, and the silanol condensation catalyst, i.e. the component (E), are essential for the manifestation of adhesive properties. When only one of them is used, no adhesive properties are manifested.

Further, for further increasing the adhesion improving effect in the practice of the invention, a silanol source compound can be used, whereby the adhesive properties can be improved and/or stabilized. As such silanol source compound, there may be mentioned, for example, silanol compounds such as triphenyl silanol and diphenyldihydroxysilane, alkoxysilanes such as diphenyldimethoxysilane, tetramethoxysilane and methyltrimethoxysilane, etc.

When such a silanol source compound is used, the amount thereof to be used can be selected at various levels. However, the lower limit to the addition level is preferably 0.05 part by weight, more preferably 1 part by weight, and the upper limit to the addition level is preferably 50 parts by weight, more preferably 30 parts by weight, per 100 parts by weight of the coupling agent and/or epoxy group-containing compound. At addition levels below 0.05 part by weight, the adhesive property-improving effect tends to become unsatisfactory and, at addition levels exceeding 50 parts by weight, the physical properties of the curing product tend to readily become poor.

Such silanol source compounds may be used singly or two or more of them may be used in combination.

In the practice of the invention, a carboxylic acid and/or an acid anhydride can be used for enhancing the effects of the coupling agent or epoxy group-containing compound, whereby the adhesive properties can be improved and/or stabilized. Such carboxylic acid or acid anhydride is not particularly restricted but includes the following:

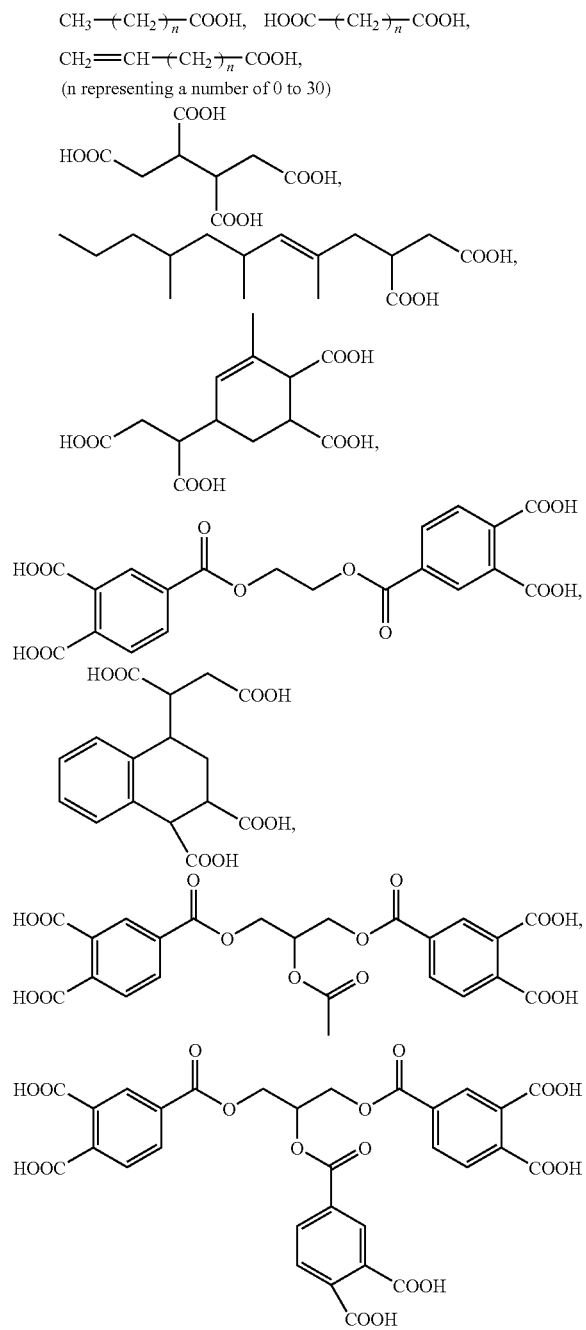

2-ethylhexanoic acid, cyclohexanecarboxylic acid, cyclohexanedicarboxylic acid, methylcyclohexanedicarboxylic acid, tetrahydrophthalic acid, methyltetrahydrophthalic acid, methylhimic acid, norbornenedicarboxylic acid, hydrogenated methylnadic acid, maleic acid, acetylenedicarboxylic acid, lactic acid, malic acid, citric acid, tartaric acid, benzoic acid, hydroxybenzoic acid, cinnamic acid, phthalic acid, tri-mellitic acid, pyromellitic acid, naphthalenecarboxylic acid, naphthalenedicarboxylic acid, and the like, as well as the acid anhydrides and mixed acid anhydrides thereof.

Among these carboxylic acids and/or acid anhydrides, those having a carbon-carbon double bond reactive with a SiH group are preferred since they have hydrosilylation reactivity, are less capable of exuding from the curing product and hardly impair the physical properties of the resulting curing product. As preferred carboxylic acids and/or acid anhydrides, there may be mentioned, for example,

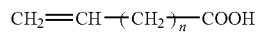

(n representing a number of 0 to 30), tetrahydrophthalic acid, methyltetrahydrophthalic acid, and anhydrides and mixed anhydrides thereof.

When such a carboxylic acid and/or acid anhydride is used, the level of addition thereof can be selected at various levels. However, the lower limit to the addition level is preferably 0.1 part by weight, more preferably 1 part by weight, and the upper limit to the addition level is preferably 50 parts by weight, more preferably 10 parts by weight, per 100 parts by weight of the coupling agent and/or epoxy group-containing compound. At addition levels lower than 0.1 part by weight, the adhesive property-improving effect tends to become unsatisfactory and, at addition levels exceeding 50 parts by weight, the physical properties of the curing product tend to readily become poor.

Such carboxylic acids and/or acid anhydrides may be used singly or two or more of them may be used in combination.

A curing retarder may be used for improving the storage stability of the curable composition of the invention or for adjusting the reactivity in the hydrosilylation reaction in the course of production. As the curing retarder, there may be mentioned aliphatic unsaturated bond-containing compounds, organophosphorus compounds, organosulfur compounds, nitrogen-containing compounds, tin compounds, organic peroxides, etc. These may also be used in combination.

The aliphatic unsaturated bond-containing compounds include, for example, propargyl alcohols, en-yne compounds, maleic acid esters, etc. The organophosphorus compounds include, for example, triorganophosphines, diorganophosphines, organophosphines, triorganophosphites, etc. The organosulfur compounds include organomercaptans, diorganosulfides, hydrogen sulfide, benzothiazole, thiazole, benzothiazole disulfide, etc. The nitrogen-containing compounds include ammonia, primary to tertiary alkylamines, arylamines, urea, hydrazine, etc. The tin compounds include stannous halide dehydrates, stannous carboxylates, etc. The organic peroxides include di-tert-butyl peroxide, dicumyl peroxide, benzoyl peroxide, tert-butyl perbenzoate, etc.

From the good retarder activity and availability viewpoint, benzothiazole, thiazole, dimethyl maleate, 3-hydroxy-3-methyl-1-butyne, and 1-ethynyl-1-cyclohexanol are preferred among these curing retarders.

The level of addition of the curing retarder can be selected at various levels but the lower limit to the addition level is preferably $10^{-1}$ mole, more preferably 1 mole, and the upper limit to the addition level is preferably $10^3$ moles, more preferably 50 moles, per mole of the hydrosilylation catalyst used.

These curing retarders may be used singly or two or more of them may be used in combination.

Then, as for the (F) component inorganic member, the same inorganic members as recited hereinabove can be adequately used. The level of incorporation of the (F) component inorganic member is not particularly restricted but preferably is 0.1 to 90% by weight of the whole amount of the curable composition of the invention. From the good applicability viewpoint, a preferred usage is not more than 80% by weight, more preferably not more than 70% by weight, still more preferably not more than 50% by weight, further preferably not more than 40% by weight, most preferably not more than 30% by weight, of the whole amount of the curable composition. When the amount is greater, the applicability tends to decrease and the light-shielding capacity tends to decrease due to defective coating results. From the good light-shielding capacity viewpoint, a preferred amount to be used is not less than 5% by weight, more preferably not less than 10% by weight, still more preferably not less than 30% by weight, particularly preferably not less than 40% by weight, most preferably not less than 50% by weight, of the whole amount of the curable composition. Thus, a preferred amount to be used for attaining a proper balance between applicability and light-shielding capacity is 10% by weight to 80% by weight, more preferably 20% by weight to 70% by weight, still more preferably 30% by weight to 60% by weight, of the whole amount of the curable composition.

Preferably, the curable composition of the present invention further contains (G) silica in addition to the above-described components (A) to (F). The (G) component silica is now described.

As the silica, there may be mentioned, for example, fumed silica, precipitated silica, quarts, silicic anhydride, fused silica, crystalline silica, ultrafine amorphous silica, etc.

The silica can provide the curable composition with thixotropic properties and/or produce a thickening effect therein. The silica preferably has an average primary particle diameter of 3 to 20 nm, particularly preferably 5 to 10 nm. The average particle diameter of silica can be measured based on an electron photomicrograph.

From the thixotropic properties viewpoint, the silica is preferably a non-surface-treated species. Nippon Aerosil's AEROSIL 300, 130, 200 and so forth, for instance, can be appropriately used as such silica species.

From the thickening effect viewpoint, it is preferably a surface-treated species. Nippon Aerosil's AEROSIL R812, R972, R974, R976, RX200, RX300 and so forth, for instance, can be adequately used as such silica species.

The surface treatment includes alkylation treatment, trimethylsilylation treatment, silicone treatment, treatment with a coupling agent, etc.

In that case, the coupling agent may be a silane coupling agent. The silane coupling agent is not particularly restricted but may be any of those compounds which have, within the molecule, at least one functional group reactive with an organic group and at least one hydrolyzable silyl group.

The functional group reactive with an organic group is preferably at least one functional group selected from among epoxy, methacryl, acryl, isocyanato, isocyanurato, vinyl and carbamato groups from the handleability viewpoint. From the viewpoint of curability and adhesive properties, epoxy, methacryl and acryl groups are particularly preferred. Preferred as the hydrolyzable silyl group from the handleability viewpoint are alkoxysilyl groups and, from the reactivity viewpoint, methoxysilyl and ethoxysilyl groups are particularly preferred.

As preferred examples of the silane coupling agent, there may be mentioned epoxy functional group-containing alkoxysilanes such as 3-glycidoxypropyltrimethoxysilane, 3-glycidoxypropyltriethoxysilane, 2-(3,4-epoxycyclohexyl)ethyltrimethoxysilane and 2-(3,4-epoxycyclohexyl)ethyltriethoxysilane; and methacryl or acryl group-containing alkoxysilanes such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane and acryloxymethyltriethoxysilane.

The amount of silica in the curable composition is not particularly restricted but, from the applicability and low fluidity viewpoint, it is preferably 0.5 part by weight to 20 parts by weight, more preferably 2 parts by weight to 10 parts by weight, most preferably 3 parts by weight to 5 parts by weight, per 100 parts by weight of the resin components [components (A) to (E)]

The curable composition of the invention preferably shows such a flow leveling property that when the composition is allowed to stand on a glass substrate inclined at an angle of 80 degrees at 100° C. for 1 hour, the flow-out distance is not longer than 2 cm, more preferably not longer than 1 cm.

More specifically, the flow leveling property is measured in the following manner. First, about 150 mg of the curable composition of the invention is applied, in a circular form, onto a glass plate (ordinary blue glass plate), 10 cm×10 cm×3 mm thickness, at a site from about 1 cm from one end of the glass plate. The glass plate is inclined at an angle of 80 degrees, with the coated portion being situated upward, and placed in an oven heated at 100° C. After the lapse of 1 hour, the distance between the front end resulting from the flow of the curable composition and the site of application is measured in cm units.

How to prepare the curable composition of the invention is now described.

The curable composition containing the above components (A) to (F) can be obtained by mixing up these components. While various methods can be employed for the mixing, it is preferred that a mixture of the components (A), (C) and (E) be mixed with a mixture of the components (B) and (D) and then the resulting mixture be mixed with the component (F). When a mixture of the components (A) and (B) is mixed with the component (C), the control of the reaction tends to become difficult. In the case of a mixture of the components (B) and (C) or (E), the reaction of the component (B) with water is promoted in the presence of the components (C) and/or (E), hence deterioration may occur during storage, etc.

On the occasion of curing of the composition by allowing the reaction to proceed, the respective necessary amounts of the components (A), (B), (C), (D) and (E) may be mixed up all at once, or the method comprising mixing up part of them, then allowing the reaction to proceed, thereafter adding the component (F) and, after mixing up with the remaining portions, further allowing the reaction to proceed, or the method comprising allowing, after mixing up, only part of the functional groups in the composition to react (converting to a B stage) by controlling the reaction conditions and/or utilizing the differences in reactivity among the substituents, then carrying out such a treatment as molding, and allowing curing to further proceed may also be employed. These methods make it easy to control the viscosity in the step of molding.

The component (F) can be mixed with the components (A) to (E) by kneading using, for example, a three-roll mill, paint mill, ball mill, etc., followed by degassing under vacuum, whereby a light-shielding paste excellent in dispersibility can be obtained. In the case of 10 g or a smaller amount, it is also possible to accomplish the mixing by stirring using a satellite type agitator/deaerator.

For obtaining a curable composition further containing the component (G) in addition to the components (A) to (F), it is preferred that a mixture of the components (A), (C) and (E) be mixed with a mixture of the components (B) and (D) and the resulting mixture be then mixed with the components (F) and (G).

When a mixture of the components (A), (C) and (E) is mixed with the components (F) and (G), the viscosity tends to increase and the workability tends to decrease. When a mixture of the components (A), (C) and (E) is mixed with the component (F) and, separately, a mixture of the components (B) and (D) is mixed with the component (G) and both the resulting mixtures are mixed together, the flow leveling property tends to increase. Further, when a mixture of the components (B) and (D) is mixed with the components (F) and (G) and the resulting mixture is mixed with a mixture of the components (A), (C) and (E), the flow leveling property tends to increase.

Now, the method of mixing a mixture of the components (A) to (E) with the component (F) and component (G) is described. Adequately usable as the mixing apparatus are, for example, a spatula, satellite type agitator/deaerator, dissolver, three-roll mill, paint mill, ball mill, etc. On the occasion of mixing, the mixture may be heated within such temperature/time ranges that will not allow curing to proceed. Specifically, the ranges not exceeding 70° C./3 hours are preferred. The heating may be conducted in the air or in an inert atmospheric gas, such as nitrogen or argon. When a satellite type agitator/deaerator or dissolver is used, curable compositions excellent in dispersibility can be obtained by degassing under vacuum. It is also possible to mature, with warming, the curable composition obtained by mixing to stabilize the properties thereof. Specifically, the maturation is carried out preferably within the temperature range of 40° C. to 60° C. for 1 hour or longer, more preferably at 50° C. for about 2 hours.

The curable composition of the invention can be cured by preliminary mixing in the manner mentioned above, followed by allowing part or the whole of the carbon-carbon double bond reactive with a SiH group and the SiH groups in the composition to react with each other to give a curing product.

The light-shielding paste of the invention comprises the above-mentioned curable composition.

The light-shielding paste of the invention can be cured by preliminary mixing in the manner mentioned above, followed by allowing part or the whole of the carbon-carbon double bond reactive with a SiH group and the SiH groups in the composition to react with each other to give a light-shielding resin.

For obtaining a light-shielding resin layer by curing the above light-shielding paste on an adherend, the reaction may be allowed to proceed by mere mixing or by heating. From the viewpoint that the reaction rate is rapid and materials generally high in heat resistance are readily obtainable, the method comprising heating to allow the reaction to proceed is preferred.

The reaction temperature can be selected at various levels and, for example, a temperature of 30 to 300° C., more preferably 50 to 250° C., still more preferably 100 to 200° C., can be applied. At lower temperatures, the reaction time required for the reaction to proceed to a satisfactory extent is prolonged and, at higher reaction temperatures, the molding operation tends to become difficult.

The reaction may be carried out at a constant temperature. If necessary, the temperature may be varied stepwise or continuously. The reaction time can also be selected at various levels. For example, the method comprising effecting preliminary curing at 60° C./1 to 10 minutes and then effecting curing at 100° C./1 to 60 minutes may be employed.

The pressure during reaction also can be selected at various levels according to need. Thus, the reaction can be carried out at ordinary pressure, at an elevated pressure or under reduced pressure.

Substances that can be added to the curable composition and light-shielding paste of the invention are now described.

For modifying the characteristics of the curable composition and light-shielding paste of the invention, it is also possible to add various thermosetting resins thereto. The thermosetting resin includes, but is not limited to, epoxy resins, cyanate ester resins, phenol resins, polyimide resins, urethane resins, bismaleimide resins, etc. Among these, epoxy resins are preferred in view of their being excellent in practical performance characteristics, such as adhesive properties.

As the epoxy resins, there may be mentioned, for example, novolak phenol-based epoxy resins, biphenyl-based epoxy resins, dicyclopentadiene-based epoxy resins, bisphenol F diglycidyl ether, bisphenol A diglycidyl ether, 2,2'-bis(4-glycidyloxycyclohexyl)propane, 3,4-epoxycyclohexylmethyl-3,4-epoxycyclohexanecarboxylate, vinylcyclohexene dioxide, 2-(3,4-epoxycyclohexyl)-5,5-spiro(3,4-epoxycyclohexane)-1,3-dioxane, bis(3,4-epoxycyclohexyl) adipate, bisglycidyl 1,2-cyclopropanedicarboxylate, triglycidyl isocyanurate, monoallyl diglycidyl isocyanurate, diallyl monoglycidyl isocyanurate, and like epoxy resins as cured with an aliphatic acid anhydride such as hexahydrophthalic anhydride, methylhexahydrophthalic anhydride, trialkyltetrahydrophthalic anhydrides or hydrogenated methylnadic anhydride. These epoxy resins and curing agents may respectively be used singly or in the form of a combination of a plurality of species.

The thermosetting resin may comprise one single species or a combination of a plurality of species.

The level of addition of the thermosetting resin is not particularly restricted. However, the lower limit to the amount to be used is preferably 5% by weight, more preferably 10% by weight, and the upper limit to the amount to be used is preferably 50% by weight, more preferably 30% by weight, of the total weight of the curable composition. At lower addition levels, the desired effects, such as adhesive properties, can hardly be obtained and, at higher levels, the curing product tends to become brittle.

The thermosetting resin may be used in the form of a raw resin and/or a cured resin and may be mixed with the component (A) and/or (B) by homogeneously dissolving therein, dispersing therein in the form of ground particles, dispersing therein in the form of a solution in a solvent or the like. From the viewpoint that the resulting curing product readily becomes more homogeneous, the resin is preferably mixed with the component (A) and/or (B) by homogeneously dissolving therein. In this case, too, the thermosetting resin may be directly dissolved in the component (A) and/or (B) or homogeneously mixed therewith using a solvent or the like, or the solvent may be removed thereafter to attain a homogeneous dispersion state and/or mixture state.

When the thermosetting resin is used in a dispersed state, the average particle diameter can be selected at various levels. Preferably, however, the lower limit to the average particle diameter is 10 nm, and the upper limit to the average particle diameter is preferably 10 μm. The particle system may have a distribution and may be monodisperse or show a plurality of peak particle diameters. From the viewpoint that the curable composition and light-shielding paste tend to be low in viscosity and show better applicability, the coefficient of variation in particle diameter is preferably not more than 10%.

For modifying the characteristics of the curable composition and light-shielding paste of the invention, it is also possible to add various thermoplastic resins thereto. The thermoplastic resin to be used may be any of various kinds. Thus, for example, it includes, but is not limited to, acrylic resins, typically poly(methyl methacrylate)-based resins such as methyl methacrylate homopolymers, or random, block or graft polymers of methyl methacrylate and another monomer, or other polymers (e.g. Optorez, product of Hitachi Chemical, etc.), and poly(butyl acrylate)-based resins such as butyl acrylate homopolymers, or random, block or graft polymers of butyl acrylate and another monomer, or other polymers; polycarbonate-type resins such as polycarbonate resins containing bisphenol A, 3,3,5-trimethylcyclohexylidenebisphenol or the like as a monomer structure (e.g. APEC, product of Teijin, etc.); cycloolefin resins such as resins resulting from homopolymerization or copolymerization of norbornene derivatives, vinyl monomers and so forth, resins resulting from ring-opening metathetic polymerization of norbornene derivatives, or hydrogenation products derived therefrom (e.g. APEL, product of Mitsui Chemical; ZEONOR and ZEONEX, products of Zeon Corporation; ARTON, product of JSR; etc.); olefin-maleimide-based resins such as ethylene-maleimide copolymers (e.g. TI-PAS, product of Tosoh, etc.); polyester resins such as polyesters resulting from polycondensation of a bisphenol such as bisphenol A or bis(4-(2-hydroxyethoxy)phenyl) fluorine and/or a diol such as diethylene glycol and a phthalic acid such as terephthalic acid or isophthalic acid and/or an aliphatic dicarboxylic acid (e.g. O-PET, product of Kanebo, etc.); polyethersulfone resins; polyarylate resins; poly(vinyl acetal) resins; polyethylene resins; polypropylene resins; polystyrene resins: polyamide resins; silicone resins; fluororesins; and, further, rubber-like resins such as natural rubbers and EPDM.

The thermoplastic resin may have a carbon-carbon double bond(s) reactive with a SiH group and/or a SiH group(s) within the molecule. In view of the tendency for the resulting curing product to have an increased level of toughness, it is preferred that it has at least one carbon-carbon double bond reactive with a SiH group and/or at least one SiH group per molecule on average.

The thermoplastic resin may have another or other crosslinking group or groups. As the crosslinking groups in that case, there may be mentioned epoxy, amino, radical-polymerizable unsaturated groups, carboxyl, isocyanato, hydroxyl, alkoxysilyl groups, etc. In view of the tendency for the resulting curing product to have an increased level of heat resistance, the occurrence of at least one crosslinking group per molecule on average is preferred.

The molecular weight of the thermoplastic resin is not particularly restricted but, from the viewpoint of better compatibility with the component (A) and/or (B), the number average molecular weight is preferably not more than 10,000, more preferably not more than 5,000. Conversely, from the viewpoint of the tendency for the resulting curing product to readily become tougher, the number average molecular weight is preferably not less than 10,000, more preferably not less than 100,000. The molecular weight distribution is not particularly restricted, either. In view of the tendency for the mixture to have a lower viscosity and better moldability, however, the molecular weight distribution is preferably not more than 3, more preferably not more than 2, still more preferably not more than 1.5.

The thermoplastic resin may comprise one single species or a combination of a plurality of species.

The level of incorporation of the thermoplastic resin is not particularly restricted but the lower limit to the amount to be used is preferably 5% by weight, more preferably 10% by weight, of the whole amount of the curable composition, and the upper limit to the amount to be used is preferably 50% by weight, more preferably 30% by weight, in the curable composition. When the addition level is less than 5% by weight, the curing product obtained tends to be brittle while addition levels exceeding 50% by weight tends to result in decreased heat resistance (elasticity at elevated temperatures).

The thermoplastic resin may be mixed with the component (A) and/or (B) by homogeneously dissolving therein, dispersing therein in the form of ground particles, dispersing therein in the form of a solution in a solvent or the like. From the viewpoint that the resulting curing product readily becomes more homogeneous, the resin is preferably mixed with the component (A) and/or (B) by homogeneously dissolving therein. In this case, too, the thermoplastic resin may be directly dissolved in the component (A) and/or (B) or homogeneously mixed therewith using a solvent or the like, or the solvent may be removed thereafter to attain a homogeneous dispersion state and/or mixture state.

When the thermoplastic resin is used in a dispersed state, the average particle diameter can be selected at various levels. Preferably, however, the lower limit to the average particle diameter is 10 nm, and the upper limit to the average particle diameter is preferably 10 µm. The particle system may have a distribution and may be monodisperse or show a plurality of peak particle diameters. In view of the tendency for the curable composition to readily become low in viscosity and show better moldability, the coefficient of variation in particle diameter is preferably not more than 10%.

A filler may be added to the curable composition and light-shielding paste of the invention.

The filler includes various species and, thus, those fillers in common use in and/or proposed as fillers for the conventional sealants, for example, typically inorganic fillers such as silver powders, glass fibers, carbon fibers, carbon black, graphite, talc, etc., as well as epoxy type ones, etc., and the like fillers can be mentioned.

To the light-shielding paste comprising a thermoplastic resin and an inorganic member and/or the light-shielding paste comprising a thermosetting resin and an inorganic member, there may also be added a silica type filler such as quartz, fumed silica, precipitated silica, silicic anhydride, fused silica, crystalline silica, ultrafine amorphous silica, etc. Such silica type filler is preferred also from the viewpoint that it makes it difficult for the curing reaction to be inhibited and is highly effective in reducing the coefficient of linear expansion.

The filler may be surface-treated where appropriate. As the surface treatment, there may be mentioned the same ones as recited hereinabove referring to the inorganic member.

Other methods of filler addition may also be mentioned. For example, mention may be made of the method of forming a filler in the curable composition or light-shielding paste which comprises adding a hydrolyzable silane monomer or oligomer, such as an alkoxysilane, acyloxysilane or halogenated silane, or an alkoxide, acyloxide or halide of a metal, such as titanium or aluminum, to the curable composition or light-shielding paste of the invention and allowing the filler formation reaction to proceed in the curable composition or light-shielding paste or the partial reaction product derived from the curable composition or light-shielding paste.

The filler preferably has an average particle diameter of not more than 10 µm, more preferably not more than 5 µm, since good permeability can be easily obtained then.

From the better permeability viewpoint, the proportion of particles having a diameter of 50 μm or larger in the filler is preferably not more than 1% by weight, more preferably not more than 0.1% by weight.

The particle diameter distribution of the filler can be selected in various ways, typically in those ways employed in and/or proposed for the fillers in the conventional sealants such as the epoxy type ones. For example, particles larger than 24 μm may amount to not less than 15% by weight while particles not larger than 1 μm may amount to not less than 3% by weight.

The average particle diameter of the filler and the proportion of particles not smaller than 50 μm in the filler can be determined using a laser microtrack particle size analyzer.

The specific surface area of the filler can be selected at various levels, typically at the levels employed or proposed for the fillers for the conventional sealants, such as the epoxy-based ones. For example, levels of not less than 4 m$^2$/g, not more than 4 m$^2$/g, not more than 10 m$^2$/g and so forth may be optionally employed.

The specific surface area can be measured using a BET method-based monosorb specific surface area measuring apparatus.

The vitrification percentage of the filler can be selected at various levels, typically at the levels employed or proposed for the fillers for the conventional sealants, such as the epoxy-based ones. For example, levels of not less than 97% can be optionally employed.

The filler preferably has a spherical shape from the viewpoint that the sealant viscosity tends to become low.

The filler may comprise one single species or a combination of two or more species.

The level of addition of the filler is not particularly restricted but, from the viewpoint that the linear expansion coefficient reducing effect is high and the composition has good fluidity, the lower limit to the addition level is preferably 30% by weight, more preferably 50% by weight, of the whole composition, and the upper limit to the addition level is preferably 80% by weight, more preferably 70% by weight, of the whole composition.

Various methods can be employed for filler incorporation. For better storage stability of the intermediate material of the curable composition or light-shielding paste, the method comprising mixing the component (B) with a mixture prepared by mixing the components (A) with the component (C) and the filler is preferred. When the component (A) is mixed with a mixture prepared by mixing the component (B) with the component (C) and/or the filler, the composition may undergo denaturation during storage, etc. since the component (B) has reactivity with the moisture in the environment and/or with the filler in the presence and/or absence of the component (C).

An antioxidant may be added to the curable composition and light-shielding paste of the invention. The antioxidant includes those in conventional use, for example citric acid, phosphoric acid, sulfur-containing antioxidants, etc. As the sulfur-containing antioxidants, there may be mentioned mercaptans, mercaptan salts, sulfide carboxylic acid esters, hindered phenol type sulfides and other sulfides, polysulfides, dithiocarboxylic acid salts, thioureas, thiophosphates, sulfonium compounds, thioaldehydes, thioketones, mercaptals, mercaptols, monothio acids, polythio acids, thioamides, sulfoxides, etc. These antioxidants may be used singly or two or more of them may be used in combination.

A radical inhibitor may be added to the curable composition and light-shielding paste of the invention. The radical inhibitor includes, for example, phenolic radical inhibitors such as 2,6-di-tert-butyl-4-methylphenol (BHT), 2,2'-methylenebis(4-methyl-6-tert-butylphenol) and tetrakis(methylene-3-(3,5-di-tert-butyl-4-hydroxyphenyl)propionate)methane, amine type radical inhibitors such as phenyl-β-naphthylamine, α-naphthylamine, N,N'-sec-butyl-p-phenylenediamine, phenothiazine and N,N'-diphenyl-p-phenylenediamine, etc. These radical inhibitors may be used singly or two or more of them may be used in combination.

An ultraviolet absorber may be added to the curable composition and light-shielding paste of the invention. The ultraviolet absorber includes, for example, 2-(2'-hydroxy-3',5'-di-tert-butylphenyl)benzotriazole, bis(2,2,6,6-tetramethyl-4-piperidine) sebacate, and so on. These ultraviolet absorbers may be used singly or two or more of them may be used in combination.

To the curable composition and light-shielding paste of the invention, there may further be added one or more of those fillers so far used and/or proposed as the fillers in the conventional sealants, such as the epoxy-based ones, as well as colorants, mold release agents, flame retardants, flame retardant auxiliaries, surfactants, antifoaming agents, emulsifiers, leveling agents, cissing preventing agents, ion trapping agents, thixotropic agents, tackifiers, storage stability improving agents, antiozonants, light stabilizers, thickening agents, plasticizers, reactive diluents, antioxidants, heat stabilizers, electric conductivity providing agents, antistatic agents, antiradiation agents, nucleating agents, phosphorus-containing peroxide decomposers, lubricants, pigments, metal inactivators, thermal conductivity providing agents, physical property modifiers and so forth, each within the range within which the object and effect of the invention will not be defeated or weakened.

The curable composition and light-shielding paste of the invention can also be used in the form of a solution in a solvent. The solvent that can be used is not particularly restricted but, specifically, hydrocarbon solvents such as benzene, toluene, hexane and heptane; ether solvents such as tetrahydrofuran, 1,4-dioxane, 1,3-dioxolane and diethyl ether; ketone solvents such as acetone, methyl ethyl ketone and methyl isobutyl ketone; and halogenated solvents such as chloroform, methylene chloride and 1,2-dichloroethane can be appropriately used. More preferred as the solvent are toluene, tetrahydrofuran, 1,3-dioxolane, and chloroform.

The amount of the solvent to be used can be selected optionally. However, the lower limit to the amount to be used is preferably 0.1 mL, and the upper limit thereto is preferably 10 mL, per gram of the curable composition or light-shielding paste to be used. When the solvent amount used is smaller than 0.1 mL, the effects of the use of a solvent, for example the viscosity reducing effect and the like effect, tends to become difficult to obtain and, when it is larger than 10 mL, the solvent tends to remain in the material, readily causing heat crack and other problems, and tends to become disadvantageous from the cost viewpoint.

Such solvents as recited above may be used singly or in the form of a mixed solvent composed of two or more species.

[LED Package and Light-Emitting Diode in which the Light-Shielding Paste of the Invention is Used]

The light-emitting diode as a semiconductor device, according to the invention, has a LED package having an aperture comprising a bottom and sidewalls and being formed of a molding resin by a monolithic process with the respective ends of an external positive electrode and an external negative electrode being exposed at a predetermined distance on the aperture bottom, and has a light-emitting element mounted on the bottom of the LED package, and is shielded against light by the light-shielding paste of the invention as coated and/or the light-shielding resin as cured therefrom substantially on the sidewalls alone of the LED package.

By saying "substantially on the sidewalls alone" herein, it is meant that even the case where the light-shielding paste of the invention flows out onto those portions of the bottom which are in the vicinity of the sidewalls and is cured in that state without producing any adverse effect on the performance characteristics of the final product light-emitting diodes of the invention is included as well within the meaning thereof.

As a semiconductor device of the invention, the one in which a light-shielding resin is formed for shielding against light on the bottom and the sidewalls of the LED package surrounding the light-emitting element can also be mentioned. "The bottom and the sidewalls of the LED package surrounding the light-emitting element" herein means part of the bottom and the sidewalls of the LED package which does not contact the light-emitting element.

In the art, thermal history in the step of setting up the semiconductor device caused a discoloration of the package resin and a decrease in reflectivity. This deteriorated the light-extraction efficiency and thereby caused a low output. Furthermore, a contact of the light-shielding resin with the light-emitting element deteriorated an extraction of light and thereby caused a low output. The present invention, however, enables preventing the decrease in reflectivity caused by the thermal history in the setting-up step by placing a light-shielding resin layer substantially on the sidewalls alone or by placing the same on the bottom and the sidewalls of the LED package for avoiding a contact with the light-emitting element, and thereby providing a semiconductor device having high emission output.

The LED package of the invention is characterized in that it has the light-shielding resin substantially on the sidewalls alone of the LED package aperture.

The package before coating with the light-shielding paste can be produced using any of various materials, for example polycarbonate resins, polyphenylene sulfide resins, epoxy resins, acrylic resins, silicone resins, ABS resins, polybutylene terephthalate resins, polyphthalamide resins, epoxy resins, BT resins, liquid crystal polymers, and like resins. From the heat resistance viewpoint, polyphthalamide resins, BT resins and liquid crystal polymers, which are semicrystalline polymer resins, are preferred. From the adhesive property viewpoint, polyphthalamide resins and polybutylene terephthalate resins, which are semicrystalline polymer resins, are preferred.

The package may be made of a ceramic.

The aperture of the package may be rectangular, circular, elliptical, or of any of various shapes.

The light-shielding paste can be applied by a printing process, a coating process, a decalcomania process and other processes, which are generally known as the methods of applying liquid resins, including, for example, the techniques of stamping technique, ink jet printing, dipping, gravure printing, mimeographing, screen printing, and application via a mask. It is also possible to apply the paste using a needle, spatula, brush, etc.

The light-emitting element to be used in the light-emitting diode of the invention is not particularly restricted but may be any of the light-emitting elements used in the light-emitting diodes known in the art. As such light-emitting element, there may be mentioned those produced by layering a semiconductor material, by any of various methods, for example the MOCVD, HDVPE, and liquid phase growth methods, on a substrate, if necessary provided with a buffer layer such as a GaN, AlN layer, etc. As the substrate in that case, various materials can be used, for example sapphire, spinel, SiC, Si, ZnO, GaN single crystals, etc. Among these, the use of sapphire is preferred since GaN with good crystallinity can be formed with ease and the industrial utility is high.

The semiconductor material to be layered includes GaAs, GaP, GaAlAs, GaAsP, AlGaInP, GaN, InN, AlN, InGaN, InGaAlN, SiC, etc. Among these, nitride compound semiconductors ($In_xGa_yAl_zN$) are preferred from the high brightness viewpoint. Such materials may contain an activator, etc.

As the structure of the light-emitting element, there may be mentioned, for example, the homojunction, heterojunction, and double-heterostructure having a MIS junction, pn junction or PIN junction. The single or multiple quantum well structure may also be employed.

The light-emitting element may have a passivation layer or have no passivation layer.

The light-emitting element can be provided with electrodes by any of the methods known in the art.

The electrodes on the light-emitting element can be electrically connected with lead terminals and so forth by various methods. The electrically connecting members are preferably ones showing good ohmic and mechanical connectivity with the electrodes of the light-emitting element, etc., for example bonding wires made of gold, silver, copper, platinum, aluminum, or alloys thereof, etc. Conductive adhesives or the like composed of a conductive filler, such as silver or carbon, and of a resin filled therewith may also be used. From the good workability viewpoint, aluminum wires or gold wires are preferably used among them.

In the light-emitting diode of the invention, any light-emitting element obtainable in the above manner can be used provided that the luminous intensity in the perpendicular direction is not less than 1 cd. When the light-emitting element has a luminous intensity in the perpendicular direction of not less than 2 cd, however, the effects of the invention can be produced more significantly and, when the luminous intensity is not less than 3 cd, the effects of the invention are still more significant.

The emission output of the light-emitting element is not particularly restricted but may be at any level. When the light-emitting element shows an output of not less than 1 mW at 20 mA, however, the effects of the invention are significant. When the light-emitting element shows an output of not less than 4 mW at 20 mA, the effects of the invention are more significant and, when the light-emitting element shows an output of not less than 5 mW at 20 mA, the effects of the invention are still more significant.

The light-emitting element that can be used may be diverse in emission wavelength range, from the ultraviolet to the infrared region. When the element shows a main emission peak wavelength of not longer than 550 nm, however, the effects of the invention are significant.

Only one such light-emitting element may be used for monochromic light emission, or a plurality of such elements may be used for monochromic or polychromic light emission.

The lead terminals to be used in the light-emitting diode of the invention are preferably ones showing good adhesion to electric connection members, such as bonding wires, good electric conductivity, etc. Thus, the lead terminals preferably have an electric resistance of not more than 300 $\mu\Omega\cdot cm$, more preferably not more than 3 $\mu\Omega\cdot cm$. As the material of these lead terminals, there may be mentioned, for example, iron, copper, iron-containing copper, tin-containing copper and, further, the products of plating of these with silver, nickel, or the like, etc. The glossiness of these lead terminals may be appropriately adjusted for attaining good spreading of light.

The light-emitting diode of the invention can be produced by coating the light-emitting element with any of various resins. In this case, the term "coating" includes, within the meaning thereof, not only direct sealing of the light-emitting element but also indirect coating. Usable as the sealing resin are epoxy resins, silicone resins, acrylic resins, urea resins, imide resins, etc. The light-emitting element may be sealed with glass as well.

Various methods can be applied as the method of sealing. For example, a liquid composition may be poured into a cup, cavity, package hollow, etc., with the light-emitting element disposed on the bottom thereof in advance, using a dispenser or by any other method, followed by curing by heating, etc. It is also possible to allowing a solid composition or highly viscous liquid composition to flow by heating, etc., pouring the same into a package hollow or the like in the same manner and causing curing by heating, etc.

The shape of the coated portion is not particularly restricted but may be diverse. For example, there may be mentioned lens-like shapes, plate-like shapes, thin film shapes, those shapes described in Japanese Kokai Publication Hei-06-244458, and the like shapes. These shapes may be formed by molding and curing of a composition or by curing of a composition, followed by after-working.

Further, various modes known in the art can be applied to the light-emitting diode of the invention. For example, there may be mentioned the mode in which a light-reflecting or light-collecting layer is provided on the back of the light-emitting element, the mode in which a complementarily colored portion is provided on the bottom to cope with sealant resin yellowing, the mode in which a thin film capable of absorbing shorter wavelength light than the main emission peak is disposed on the light-emitting element, the mode in which the light-emitting element is sealed with a soft or liquid sealant and then the circumference is molded with a hard material, the mode in which the light-emitting element is sealed with a material containing a fluorescent substance absorbing the light from the light-emitting element and emitting a longer wavelength fluorescent light and the circumference is then molded, the mode in which a material containing a fluorescent substance is shaped in advance and then molded together with the light-emitting element, the mode in which a molding material is formed into a special shape to thereby increase the emission efficiency, as described in Japanese Kokai Publication Hei-06-244458, the mode in which the package is provided with a two-stage hollow to reduce the unevenness of brightness, the mode in which the light-emitting diode is immobilized by insertion into a through hole, the mode in which a thin film capable of absorbing a shorter wavelength light than the main emission wavelength is formed on the light-emitting element surface, the mode in which the light-emitting element is connected with lead members and the like by flip chip bonding or the like using solder bumps, etc., for taking out light in the direction of the substrate and the like modes.

The light-emitting diode of the invention can be used in various fields of use known in the art. Specifically, such uses include backlights, illumination, light sources for sensors, light sources for gauges in vehicles, signal lamps, display lamps, display devices, light sources for planar light emitters, displays, decorations, various lights, etc.

Second Aspect of the Invention

The method of light-shield resin layer formation according to the invention is now described.

The method of forming a light-shielding resin layer on the sidewalls alone of a LED package having an aperture comprising a bottom and sidewalls and formed of a molding resin by a monolithic process with the respective ends of an external positive electrode and an external negative electrode being exposed at a predetermined distance on the aperture bottom can be roughly divided into the following three stages.

(1) The step of applying a light-shielding paste to a substrate;

(2) The step of bringing the LED package aperture into close contact therewith; and (3) The step of heating the LED package with the aperture facing upward.

In the following, the steps are described one by one.

(1) Step of Applying a Light-Shielding Paste to a Substrate

The light-shielding paste can be applied to the substrate by any of various methods known in the art. Usable as the material of the substrate are, for example, resins, rubbers, glasses, ceramics, metals and so forth. As for the shape of the substrate, flat plates, horizontal plates, plate-like belts, Δ-shaped rolls and various other planar substrates as well as rolls, balls and other various curved substrates can be used.

The light-shielding paste can be applied to the substrate by various methods, for example by casting, coating, T die extrusion, dipping in a bath filled with the light-shielding paste, or the like methods. For controlling the film thickness, various spacers can be used. The time of application is preferably 0.1 second to 24 hours, more preferably 1 second to 1 hour, most preferably 1 minute to 30 minutes. The application temperature is preferably 5° C. to 100° C., more preferably 10° C. to 50° C., most preferably 15° C. to 30° C. The application can be adequately carried out under vacuum, in the air, or in an inert gas, such as nitrogen or argon. Usable as the heating oven are hot air circulation ovens, infrared heating ovens, and various other ones. For preventing the contamination with a foreign matter and so on, this step is preferably carried out in a clean room.

(2) Step of Bringing the LED Package Aperture into Close Contact Therewith

The LED package aperture is brought into close contact with the substrate coated with the light-shielding paste as prepared in step (1) to thereby allow the light-shielding paste to adhere to the upper part of the aperture. When the substrate coated with the light-shielding paste is a flat one, the close contacting with the LED package aperture can be carried out various methods, for example by the package's own weight, by pressure application using a press, pressure application using a roll, or the like methods. When the substrate coated with the light-shielding paste is a curved one, for example a roll-like one, the light-shielding paste can be allow to adhere to the upper part of the aperture of the LED package by rolling the roll along the aperture or by passing the substrate between a roll pair so that the LED package aperture may come into close contact with the roll coated with the light-shielding paste.

The time of close contacting is preferably 0.01 second to 24 hours, more preferably 0.1 second to 1 hour, most preferably 1 second to 5 minutes. The close contacting temperature is preferably 5° C. to 100° C., more preferably 10° C. to 50° C., most preferably 15° C. to 30° C. The adhering amount of the light-shielding paste can be controlled by adjusting the close contacting temperature and time. The close contacting can be properly carried out under vacuum, in the air, or in an inert gas, such as nitrogen or argon. Usable as the heating oven are hot air circulation ovens, infrared heating ovens, and various other ones. For preventing the contamination with a foreign matter and so on, this step is preferably carried out in a clean room.

(3) Step of Heating the LED Package with the Aperture Facing Upward

Then, the LED package is heated with the aperture thereof facing upward, while controlling the heating time/temperature, whereby the light-shielding paste caused to adhere to the upper part of the package aperture in step (2) can be allowed to spread along the LED package sidewalls alone. The phrase "with the LED package aperture facing upward" as used herein means a condition of the bottom electrode surface of the LED package facing upward with the bottom electrode surface situated perpendicular to the vertical axis.

As for the accuracy of the perpendicular position, a deviation not exceeding about ±10 degrees is allowable if no great troubles are caused in the step (3) of the invention. The heating temperature can be appropriately selected according to the adhering amount, viscosity and thixotropy index of the light-shielding paste, etc. For preventing package degradation, the temperature is preferably 3° C. to 200° C., more preferably 40° C. to 100° C., most preferably 50° C. to 80° C. The heating time can be selected according to the adhering amount, viscosity and thixotropy index of the light-shielding paste, etc. From the productivity viewpoint, it is preferably not longer than 1 hour, more preferably not longer than 30 minutes, most preferably not longer than 15 minutes. The heating can be adequately carried out under vacuum, in the air, or in an inert gas, such as nitrogen or argon. Usable as the heating oven are hot air circulation ovens, infrared heating ovens, and various other ones. The heating may also be carried out stepwise, for example at 60° C. for 30 minutes, then at 80° C. for 30 minutes, and at 100° C. for 30 minutes.

The light-shielding paste which can be used in carrying out the method of forming light-shielding resin layers according to the invention is now described.

Suited for use as the light-shielding paste are the light-shielding paste described hereinabove and a light-shielding paste comprising the curable composition described hereinabove, etc.

The viscosity of the light-shielding paste may be diverse. For securing good applicability, it is preferred that the viscosity at ordinary temperature (23° C.) be high and the viscosity decrease upon heating (30° C.). At ordinary temperature (23° C.), the viscosity is preferably not lower than 10 poises and, under heating (30° C.), it is preferably not lower than 1 poise. The viscosity can be measured using a type E rotational viscometer.

If the light-shielding paste has a great thixotropy index, the fluidity will become poor, leading to failure to accomplish the objects of the invention. Therefore, the thixotropy index (viscosity ratio) at 23° C. is preferably 0.8 to 1.2, more preferably 0.9 to 1.1, most preferably 0.95 to 1.05. The thixotropy index (viscosity ratio) can be determined using a type E rotational viscometer. As for the number of revolutions of the viscometer, the value of 10 rpm/1 rpm is generally employed. However, combined values, such as 20 rpm/2 rpm, 50 rpm/5 rpm and 5 rpm/0.5 rpm, are also employable.

If the light-shielding paste is excessively high in curability, the light-shielding paste will be cured prior to spreading over the whole package sidewalls in the step (3) of heating the LED package with the aperture thereof facing upward, hence no good light-shielding layer can be obtained. Therefore, the time of curing at 115° C. is preferably 15 seconds to 90 seconds, more preferably 20 seconds to 75 seconds, most preferably 30 seconds to 60 seconds. The curing time can be evaluated in terms of gel time, also called snap-up time. A method of measurement to be used is described in the following. About 50 mg of the light-shielding paste is pressed against a hot plate (115° C.±3° C.) and, at the same time, a stopwatch is started. Further, the paste is spread with a spatula, and the time required for the light-shielding paste to lose its fluidity is reported as the curing time.

If the light-shielding paste is high in fluidity, it will flow down from the package sidewalls onto the bottom electrode portion in the step (2) of brining the LED package aperture into close contact and/or the step (3) of heating the LED package with the aperture thereof facing upward, with the result that such troubles as failure to break connections in the LED chip will occur. Therefore, the light-shielding paste preferably has an appropriate degree of fluidity. On the other hand, unless such troubles as the above-mentioned failure to break connections will substantially occur, flowing down of a part of the paste onto the bottom, followed by curing causes no problem.

The fluidity can be evaluated by the method comprising allowing the light-shielding paste to spread on a glass plate. A method to be employed is as follows. About 50 mg of the light-shielding paste is applied in a circular form, about 8 mm in diameter, onto a glass plate, the glass plate is then immobilized at an inclination of about 80 degrees and maintained at about 21° C. for 10 minutes, and the flow-down distance is measured. The flow-down distance is preferably 5 mm to 30 mm, more preferably 5 to 20 mm, most preferably 5 to 15 mm. Further, when the glass plate is maintained at about 60° C. for 5 minutes, the flow-down distance is preferably 10 mm to 70 mm, more preferably 10 to 40 mm, most preferably 10 to 30 mm. The heating can be carried out using a hot air circulating oven.

The light-shielding resin obtained by curing the above light-shielding paste is now described.

The light-shielding resin is required to have heat resistance to endure solder reflow and so on. If the heat resistance is low, the resin will discolor on the occasion of solder reflow to cause a decrease in brightness of the LED. Therefore, it is preferred that the light-shielding resin produced from the light-shielding paste be highly resistant to heat. The heat resistance can be evaluated by heating the light-shielding resin formed by applying the light-shielding paste onto a substrate at 260° C. for 3 minutes and evaluating the yellowness (yellow index, YI) of the light-shielding resin. When the initial yellowness value is taken as 100, the value after heating at 260° C. for 3 minutes is preferably 100 to 150, more preferably 100 to 140, most preferably 100 to 130. The yellowness can be measured using a colorimeter.

The light-shielding resin is required to be resistant to light since it reflects the light from the LED chip. If the light resistance is low, discoloration will occur, causing a decrease in brightness of the LED. Therefore, it is preferred that the light-shielding resin produced from the light-shielding paste be highly resistant to light. The light resistance is evaluated by subjecting the light-shielding resin formed by applying the light-shielding paste onto a substrate to light irradiation. The light resistance test was carried out using Suga Test Instruments' super xenon weatherometer under the following test conditions for 330 hours: irradiation illuminance 0.18 kW/m$^2$, test cycles each comprising 1 hour and 42 minutes of irradiation and 18 minutes of raining, black panel temperature 63° C., humidity 500. When the initial yellowness value is taken as 100, the value after the light resistance test using the xenon weatherometer is preferably 100 to 150, more preferably 100 to 140, most preferably 100 to 130. The yellowness can be measured using a colorimeter.

Preferably, the light-shielding resin has an appropriate film thickness so that the required light-shielding ability may be secured. The film thickness is preferably 1 to 1,000 μm, more preferably 5 to 500 μm, most preferably 50 to 100 μm. The film thickness can be measured by nondestructive testing using an acoustic microscope, an X ray fluoroscope, etc. It can also be measured by preparing sections containing the light-shielding resin and the substrate surface and using a scanning electron microscope (SEM).

The light-shielding resin is required to be highly adhesive to the package so that the reliability of the LED may be secured. If the adhesion is weak, peeling will occur between the package and molding resin and the LED will fail to emit light. The adhesion can be evaluated by die shear testing of a substrate with the light-shielding resin layer formed thereon. Useful as the die shear testing machine is, for example, Dage's multi-purpose bondtester 2400. A light resistance test was carried out using Suga Test Instruments' super xenon weatherometer under the following test conditions for 330 hours: irradiation illuminance 0.18 kW/m$^2$, test cycles each comprising 1 hour and 42 minutes of irradiation and 18 minutes of raining, black panel temperature 63° C., humidity 50%. When the initial bond strength value is taken as 100, the value after the light resistance test using the xenon weatherometer is preferably not less than 70, more preferably not less than 80, most preferably not less than 90.

The light-shielding paste to be used in the method of light-shielding resin formation according to the invention as well as the light-shielding resin of the invention can be appropriately applied to the LED package and light-emitting diode. The LED package and light-emitting diode are as described hereinabove.

BEST MODE FOR CARRYING OUT THE INVENTION

The following examples and comparative examples illustrate the present invention. They are, however, by no means limitative of the scope of the present invention.

Synthesis Example 1

Synthesis of Triallyl isocyanurate-1,3,5,7-tetramethylcyclotetrasiloxane Reaction Product, which is a Component (B)

A 5-L separable flask was charged with 1.8 kg of toluene and 1.44 kg of 1,3,5,7-tetramethylcyclotetrasiloxane, and heated until the inside temperature arrived at 104° C. Thereto was added dropwise a mixture of 200 g of triallyl isocyanurate, 1.44 mL of a xylene solution of platinum-vinylsiloxane complex (containing 3% by weight of platinum) and 200 g of toluene. The resulting mixture was heated under reflux in an oil bath at 120° C. for 7 hours. Then, 1.7 g of 1-ethynyl-1-cyclohexanol was added. The unreacted portion of 1,3,5,7-tetramethylcyclotetrasiloxane and the toluene were distilled off under reduced pressure. $^1$H-NMR revealed that the product was the reaction product resulting from part of the SiH groups of 1,3,5,7-tetramethylcyclotetrasiloxane with triallyl isocyanurate (hereinafter referred to as partial reaction product B1, SiH value: 8.2 mmol/g, allyl value: 0.12 mmol/g). The product is a mixture but contains, as a main component, the compound having the structure given below, which is the component (B) of the invention. It also contains the platinum-vinylsiloxane complex, which is the component (C) of the invention.

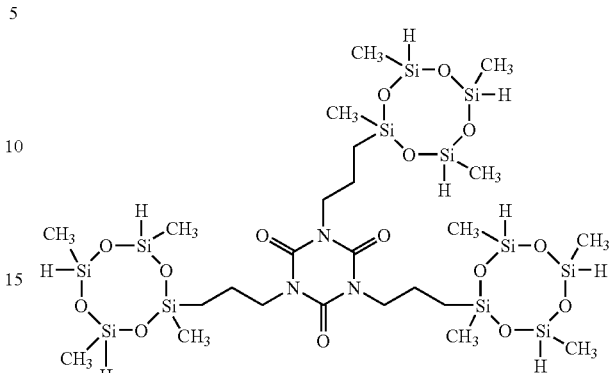

Example 1

A mixture of 54.51 g of triallyl isocyanurate and 87.03 g of diallyl monoglycidyl isocyanurate was used as component (A), 162.64 g of the reaction product (B1) prepared in Synthesis Example 1 as component (B), 913 mg of a platinum-vinylsiloxane complex solution in xylene (containing 3% by weight of platinum) as component (C), 7.60 g of γ-glycidoxypropyltrimethoxysilane as component (D), and 1.52 g of trimethyl borate as component (E). A mixture (mixture A) was prepared in advance by mixing up the above components (A), (C) and (E) with stirring. Separately, a mixture (mixture B) was prepared in advance by mixing up the above components (B) and (D) and 90 mg of 1-ethynyl-1-cyclohexanol with stirring. A one-pot mixture was prepared by mixing up the above mixtures A and B with stirring and degassing. A 2.5-g portion of the resulting mixture was admixed with 2.5 g of titanium oxide (Ishihara Sangyo Kaisha, Ltd.'s TIPAQUE R-820) (component F), followed by stirring and degassing to give a light-shielding paste.

Example 2

A 2.5-g portion of the one-pot mixture of the components (A) to (E) as obtained in Example 1 was admixed with 2.5 g of titanium oxide (Ishihara Sangyo Kaisha, Ltd.'s TIPAQUE R-820) (component F) and further with 75 mg of silica (Nippon Aerosil's AEROSIL 300), followed by stirring and degassing to give a light-shielding paste.

Example 3

Triallyl isocyanurate (12.04 g) was used as component (A), 17.96 g of the reaction product (B1) obtained in Synthesis Example 1 as component (B), 90 mg of a platinum-vinylsiloxane complex solution in xylene (containing 3% by weight of platinum) as component (C), 750 mg of γ-glycidoxypropyltrimethoxysilane as component (D), and 150 mg of trimethyl borate as component (E). A mixture (mixture A) was prepared in advance by mixing up the above components (A), (C) and (E) with stirring. Separately, a mixture (mixture B) was prepared in advance by mixing up the above components (B) and (D) and 90 mg of 1-ethynyl-1-cyclohexanol with stirring. A one-pot mixture was prepared by mixing the above mixtures A and B together with stirring and degassing. A 2.5-g portion of the resulting mixture was admixed with 2.5 g of titanium oxide (Ishihara Sangyo Kaisha, Ltd.'s TIPAQUE R-820) (component F) and further with 125 mg of silica (Nippon Aerosil's AEROSIL 300), followed by stirring and degassing to give a light-shielding paste.

Example 4

The light-shielding pastes obtained in Examples 1 to 3 were each applied onto a polyphthalamide resin molding while controlling the film thickness using a tape as a spacer, and then cured at 100° C. for 1 hour to form a light-shielding layer. A die for die shear testing was bonded to each light-shielding layer with an adhesive prepared in the manner mentioned below.

The adhesive layer was formed by heating at 60° C. for 6 hours, 70° C. for 1 hour, 80° C. for 1 hour, 120° C. for 1 hour, 150° C. for 1 hour and 180° C. for 30 minutes, in that order, followed by curing.

Comparative Example 1

A die for die shear testing was bonded onto a polyphthalamide resin molding with an adhesive prepared in the manner mentioned below.

The adhesive layer was formed by heating at 60° C. for 6 hours, 70° C. for 1 hour, 80° C. for 1 hour, 120° C. for 1 hour, 150° C. for 1 hour and 180° C. for 30 minutes, in that order, followed by curing.

<Adhesive Component Preparation>

A mixture (mixture A) was prepared in advance by mixing, with stirring, 12.04 g of triallyl isocyanurate, 90 mg of a platinum-vinylsiloxane complex solution in xylene (containing 3% by weight of platinum) and 150 mg of trimethyl borate together. Separately, a mixture (mixture B) was prepared in advance by mixing, with stirring, 17.96 g of the reaction product (B1) obtained in Synthesis Example 1, 750 mg of γ-glycidoxypropyltrimethoxysilane and 90 mg of 1-ethynyl-1-cyclohexanol together. The above mixtures A and B were mixed together, followed by stirring and degassing to give an adhesive component.

<Die Preparation for Die Shear Testing>

A mixture (mixture A) was prepared in advance by mixing, with stirring, 12.04 g of triallyl isocyanurate, 90 mg of a platinum-vinylsiloxane complex solution in xylene (containing 3% by weight of platinum) and 150 mg of trimethyl borate together. Separately, a mixture (mixture B) was prepared in advance by mixing, with stirring, 17.96 g of the reaction product (B1) obtained in Synthesis Example 1, 750 mg of γ-glycidoxypropyltrimethoxysilane and 90 mg of 1-ethynyl-1-cyclohexanol together. The above mixtures A and B were mixed up with stirring and degassing to give a one-pot mixture.

The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour, 150° C. for 1 hour and 180° C. for 30 minutes, in that order, followed by curing. The transparent molding obtained was cut, using a diamond cutter, to dies with a size of 3 mm (length)×3 mm (width)×1 mm (thickness).

Measurement Example 1

The test specimens obtained in Example 4 and Comparative Example 1 were evaluated for adhesion by die shear testing. Used as the die shear tester was Dage's multi-purpose bondtester 2400. The temperature was 23° C., a 50-kgf load cell was used, and the testing speed was 83 μm/sec. The results obtained are shown in Table 1.

Measurement Example 2

The test specimens obtained in Example 4 and Comparative Example 1 were subjected to light resistance testing in a state such that the bonded surface was irradiated with light through the die. The light resistance test was carried out using Suga Test Instruments' super xenon weatherometer under the following test conditions for 330 hours: irradiation illuminance 0.18 kW/m², test cycles each comprising 1 hour and 42 minutes of irradiation and 18 minutes of raining, black panel temperature 63° C., humidity 50%. The test specimens after light resistance testing were evaluated for adhesion by die shear testing under the same conditions as in Measurement Example 1. The results thus obtained are shown in Table 1.

TABLE 1

| | Die shear test | | | |
|---|---|---|---|---|
| | Paste thickness, μm | Initial, kgf | Paste thickness, μm | After irradiation, kgf |
| Example 1 | Thin(27) | 21 | Thin(24) | 21 |
| | Thick(110) | 27 | Thick(119) | 35 |
| Example 2 | Thin(22) | 19 | Thin(23) | 18 |
| | Thick(125) | 33 | Thick(113) | 35 |
| Example 3 | Thin(12) | 3 | Thin(21) | 3 |
| | Thick(125) | 7 | Thick(131) | 8 |
| Compar. Example 1 | — | 23 | — | 15 |

*) Die shear test: n = 5. Each test value is a mean of n = 3, with the maximum and minimum values being eliminated.

As is evident from Table 1, the light-shielding pastes of the invention showed no decrease in adhesion after light resistance testing and had light-shielding ability. They showed no discoloration and had high light resistance even after light resistance testing. Therefore, the curable compositions of the invention can be adequately used as light-shielding pastes.

Synthesis Example 2

A mixture of 54.51 g of triallyl isocyanurate and 87.03 g of diallyl monoglycidyl isocyanurate was used as component (A), 162.64 g of the reaction product (B1) obtained in Synthesis Example 1 as component (B), 913 mg of a platinum-vinylsiloxane complex solution in xylene (containing 3% by weight of platinum) as component (C), 7.60 g of γ-glycidoxypropyltrimethoxysilane as component (D), and 1.52 g of trimethyl borate as component (E). A mixture (mixture A) was prepared in advance by mixing up the above components (A), (C) and (E) with stirring. Separately, a mixture (mixture B) was prepared in advance by mixing up the above components (B) and (D), together with 913 mg of 1-ethynyl-1-cyclohexanol, with stirring.

Example 5

The mixture A (114 g) and 136 g of the mixture B, prepared in Synthesis Example 2, were stirred for 10.5 minutes using a satellite type agitator/defoamer (Kurabo Industries, MAZERUSTAR KK-500). Thereto was added 250 g of titanium oxide (Ishihara Sangyo Kaisha, Ltd., TIPAQUE R-820) as component (F), and the mixture was stirred using a satellite type agitator/defoamer for 2 minutes. Thereto was added 7.5 g of silica (Nippon Aerosil, AEROSIL 300) as component (G). The subsequent 120 minutes of stirring gave a curable composition.

The curable composition had a viscosity (0.5 rpm/1 rpm) of 46 Pa·s/31 Pa·s as measured on a type E viscometer. A 150-mg portion of the curable composition was applied, in a circular form, on a blue glass plate, 10 cm×10 cm×3 mm (thickness), at a site about 1 cm from one end of the glass plate. The glass plate was placed in an oven heated at 100° C. at an angle of inclination of 80 degrees with the coated portion of the glass plate being located upward. After the lapse of 1 hour, the curable composition showed no spreading, hence the flow leveling was 0 cm.

Example 6

The mixture A (363 g) and mixture B (434 g), prepared in Synthesis Example 2, were stirred in a dissolver for 3 minutes. Thereto was added 800 g of titanium oxide (Ishihara Sangyo Kaisha, Ltd., TIPAQUE R-820) as component (F), followed by 14 minutes of stirring in the dissolver. Thereto was added 24 g of silica (Nippon Aerosil, AEROSIL 300) as component (G), followed by 49 minutes of mixing to give a curable composition.

The curable composition had a viscosity (0.5 rpm/1 rpm) of 39 Pa·s/26 Pa·s as measured on a type E viscometer. A 150-mg portion of the curable composition was applied, in a circular form, on a blue glass plate, 10 cm×10 cm×3 mm (thickness), at a site about 1 cm from one end of the glass plate. The glass plate was placed in an oven heated at 100° C. at an angle of inclination of 80 degrees with the coated portion of the glass plate being located upward. After the lapse of 1 hour, the curable composition showed no spreading, hence the flow leveling was 0 cm.

Example 7

A 46-g portion of the mixture A prepared in Synthesis Example 2, 46 g of titanium oxide (Ishihara Sangyo Kaisha, Ltd., TIPAQUE R-820) as component (F) and 1.4 g of silica (Nippon Aerosil, AEROSIL 300) as component (G) were stirred together in a satellite type agitator/defoamer. Separately, 55 g of the mixture B, 55 g of titanium oxide (Ishihara Sangyo Kaisha, Ltd., TIPAQUE R-820) as component (F) and 1.7 g of silica (Nippon Aerosil, AEROSIL 300) as component (G) were stirred together in a satellite type agitator/defoamer. The mixture A-titanium oxide-silica mixture (30.0 g) and the mixture B-titanium oxide-silica mixture (35.7 g) were mixed together in an agitator/defoamer.

The resulting curable composition had a viscosity (0.5 rpm/2.5 rpm) of 17 Pa·s/12 Pa·s as measured on a type E viscometer. A 150-mg portion of the curable composition was applied, in a circular form, on a blue glass plate, 10 cm×10 cm×3 mm (thickness), at a site about 1 cm from one end of the glass plate. The glass plate was placed in an oven heated at 100° C. at an angle of inclination of 80 degrees with the coated portion of the glass plate being located upward. After the lapse of 1 hour, the curable composition showed spreading, and the flow leveling was not less than 9 cm.

Example 8

A 46-g portion of the mixture A prepared in Synthesis Example 2, and 3 g of silica (Nippon Aerosil, AEROSIL 300) as component (G) were stirred together in a satellite type agitator/defoamer. Separately, 54 g of the mixture B, and 100 g of titanium oxide (Ishihara Sangyo Kaisha, Ltd., TIPAQUE R-820) as component (F) were stirred together in a satellite type agitator/defoamer. The mixture A-silica mixture (30.2 g) and the mixture B-titanium oxide mixture (95.9 g) were mixed together in an agitator/defoamer.

The resulting curable composition had a viscosity (0.5 rpm/1.0 rpm) of 17 Pa·s/12 Pa·s as measured on a type E viscometer. A 150-mg portion of the curable composition was applied, in a circular form, on a blue glass plate, 10 cm×10 cm×3 mm (thickness), at a site about 1 cm from one end of the glass plate. The glass plate was placed in an oven heated at 100° C. at an angle of inclination of 80 degrees with the coated portion of the glass plate being located upward. After the lapse of 1 hour, the curable composition showed spreading, and the flow leveling was not less than 9 cm.

Example 9

A 54-g portion of the mixture B prepared in Synthesis Example 2, 100 g of titanium oxide (Ishihara Sangyo Kaisha, Ltd., Tipaque R-820) as component (F) and 3 g of silica (Nippon Aerosil, AEROSIL 300) as component (G) were stirred together in a satellite type agitator/defoamer. The mixture A (22.5 g) prepared in Synthesis Example 2 and the mixture B-titanium oxide-AEROSIL mixture (77.5 g) were mixed together in an agitator/defoamer.

The resulting curable composition had a viscosity (1.0 rpm/2.5 rpm) of 9 Pa·s/10 Pa·s as measured on a type E viscometer. A 150-mg portion of the curable composition was applied, in a circular form, on a blue glass plate, 10 cm×10 cm×3 mm (thickness), at a site about 1 cm from one end of the glass plate. The glass plate was placed in an oven heated at 100° C. at an angle of inclination of 80 degrees with the coated portion of the glass plate being located upward. After the lapse of 1 hour, the curable composition showed spreading, and the flow leveling was not less than 9 cm.

Example 10

A mixture of 54.51 g of triallyl isocyanurate and 87.03 g of diallyl monoglycidyl isocyanurate was used as component (A), 162.64 g of the reaction product (B1) prepared in Synthesis Example 1 as component (B), 913 mg of a platinum-vinylsiloxane complex solution in xylene (containing 3% by weight of platinum) as component (C), 7.60 of γ-glycidoxypropyltrimethoxysilane as component (D), and 1.52 g of trimethyl borate as component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. A 2.5-g portion of the resulting mixture was admixed with 2.5 g of titanium oxide (Ishihara Sangyo Kaisha, Ltd., TIPAQUE R-820) (component F) and further with 25 mg of silica (Nippon Aerosil, AEROSIL R812), followed by stirring and degassing to give a light-shielding paste.

Example 11

A 2.5-g portion of the one-pot mixture composed of the components (A) to (E) as obtained in Example 10 was admixed with 0.625 g of titanium oxide (Ishihara Sangyo Kaisha, Ltd., TIPAQUE R-820) as component (F) and further with 250 mg of silica (Nippon Aerosil, AEROSIL R812), followed by stirring and degassing to give a light-shielding paste.

Example 12

Triallyl isocyanurate (12.04 g) was used as component (A), 17.96 g of the reaction product (B1) prepared in Synthesis Example 1 as component (B), 90 mg of a platinum-vinylsiloxane complex solution in xylene (containing 3% by weight of platinum) as component (C), 750 mg of γ-glycidoxypropyltrimethoxysilane as component (D), and 150 mg of trimethyl borate as component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. A 2.5-g portion of the resulting mixture was admixed with 2.5 g of titanium oxide (Ishihara Sangyo Kaisha, Ltd., TIPAQUE R-820) (component F) and further with 188 mg of silica (Nippon Aerosil, AEROSIL R812), followed by stirring and degassing to give a light-shielding paste.

Example 13

The light-shielding paste obtained in Example 11 was subjected to curing time measurement. The curing time measured in terms of snap-up time at 115° C. was 32 seconds and, thus, the light-shielding paste was applicable in practicing the method of light-shielding resin layer formation according to the invention.

Example 14

A 50-mg portion each of the light-shielding pastes described in Examples 10 to 12 was applied, in a circular form with a diameter of 8 mm, onto a glass plate. The glass plate was fixed at an inclination of 80 degrees and maintained at 21° C. for 10 minutes for flow-down distance evaluation. The results were as follows: Example 10; 2 cm, Example 11; 2 cm, and Example 12; 2.5 cm. Thus, the light-shielding pastes were applicable in practicing the method of light-shielding resin layer formation according to the invention.

Example 15

A 50-mg portion each of the light-shielding pastes described in Examples 10 to 12 was applied, in a circular form with a diameter of 8 mm, onto a glass plate. The glass plate was fixed at an inclination of 80 degrees and maintained at 60° C. for 5 minutes for flow-down distance evaluation. The results were as follows: Example 10; 4.5 cm, Example 11; 3.5 cm, and Example 12; 4.0 cm. Thus, the light-shielding pastes were applicable in practicing the method of light-shielding resin layer formation according to the invention.

Example 16

Using a 50-μm polyester tape as a spacer, a glass plate was coated with each of the light-shielding pastes obtained in Examples 10 to 12 by means of a glass rod at 21° C. On each preparation was mounted a resin-made LED package (about 3×2×1 mm (thick)), on the face opposite to the package aperture, using a double stick tape. Each test unit comprised 10 LED packages. The aperture of each package was brought into close contact with the light-shielding paste applied on the glass plate at 21° C. for about 1 second. With the aperture facing upward, each package was heated in a hot air drier at 60° C. for 5 minutes.

The light-shielding pastes obtained in Examples 10 to 12 showed no spreading onto the bottom electrode surface of the package bottom. Thus, each light-shielding paste was applied to form a light-shielding resin layer on the package aperture sidewalls alone. The time required for application was within 6 minutes.

Comparative Example 2

The same LED packages as used in Example 16 were coated with the light-shielding pastes obtained in Examples 10 to 12 using a needle. For coating all the 10 packages on the sidewalls alone, 30 minutes or a longer time was required and, in addition, it was revealed that the application time greatly depends on the workers' skill, the work very readily causes eye fatigue, and this method cannot be utilized on a mass production scale.

Thus, the method of light-shielding resin formation according to the invention is efficient and conducive to improvements in productivity.

Example 17

Firstly, as a semiconductor element, a nitride semiconductor layer was formed by sequentially forming an n-type layer, an active layer and a p-type layer on a sapphire substrate, and part of the n-type layer was exposed by part of the active layer and part of the p-type layer being removed. On this exposed n-type layer and p-type layer, an n-electrode and a p-electrode were respectively formed. Then a light-emitting element of a gallium nitride compound semiconductor capable of emitting a blue light with its peak wavelength of monochromatic emission being 475 nm of a visible light was formed.

And, a molded package was made by using a thermoplastic resin (polyphthalamide) having high-reflectivity due to a pigment such as titanium oxide as a housing material. In other words, 40 parts by weight of glass fiber as a reinforcement, 20 parts by weight of titanium oxide as a pigment and a slight amount of a heat stabilizer were added to 100 parts by weight of polyphthalamide resin and the resulting mixture was kneaded, and then subjected, with a silver-plated lead frame, to injection molding into a monolithic frame.

The obtained molded package was a rectangular parallelepiped with 3.5 mm long, 2.8 mm wide and 2.0 mm high. The molded package had a recessed aperture, and a light-emitting element was mounted on the bottom of the recess. The recessed aperture of the molded package was a rectangular-like shape with 3.1 mm long and 2.4 mm wide. The recess of the molded package was a tapered shape with a wider opening. A sealing resin was injected into the recess so as to cover the mounted light-emitting element, and then cured. The molded package had a pair of electrodes whose one end was formed to be inserted into the molded package and the other end was formed to project from the outer wall of the molded package. Part of the main surface of each lead electrode was exposed respectively at the bottom of the second recess.

A light-emitting element was fixed by die bonding in the recess of the molded package, using epoxy resins. An Au line, which is a conductive wire, was electrically connected to respective electrodes of the light-emitting element and respective lead electrodes by wire bonding.

Thereafter, the curable composition prepared in Example 6 was applied, as a high-reflective coating member, to the sidewalls of the recess of the molded package in the manner of having no contact with the light-emitting element, then dried, and cured at about 100° C. for about 1 hour.

A sealing resin comprising a combination of 10 g of mixed solution A and 11.9 g of mixed solution B, of Synthesis Example 2, was injected, as a sealing member, onto the recess of the molded package. This resin was cured under the condition of at 60° C. for about 6 hours, at 70° C. for about 1 hour, at 80° C. for about 1 hour, at 120° C. for about 1 hour, at 150° C. for about 1 hour and at 180° C. for about 0.5 hour in order to prepare a light-emitting diode as a semiconductor device.

Comparative Example 3

The procedure of the above Example 17 was followed in the same manner except that the high-reflective coating member was not applied to the recess of the molded package, and a light-emitting diode was prepared.

Measurement Example 3

The optical output of the obtained light-emitting diode was measured. As a result, shown in Table 2, the optical output obtained in the light-emitting diode in Example 17 was about 5,800 µW at 20 mA, while the optical output obtained in the light-emitting diode in Comparative Example 3 was only about 4,670 µW under the same condition. Thus, it was confirmed that the initial optical output was improved in the light-emitting diode in Example 17, compared with the light-emitting diode in Comparative Example 3.

TABLE 2

|  | Example 17 | Compar. Example 3 |
|---|---|---|
| Optical output | 5.800 µW | 4.670 µW |

The light-emitting diodes prepared in Example 17 and Comparative Example 3 were subjected to reflow packaging at 260° C., and a decrease in the optical output was measured with the initial value of the optical output being taken as 100. The results obtained are shown below.

TABLE 3

|  | Initial | 1 st | 2 nd | 3 rd |
|---|---|---|---|---|
| Example 17 | 100 | 92.6 | 86.8 | 83.5 |
| Compar. Example 3 | 100 | 87.7 | 81.4 | 76.6 |

As is evident from Table 3, it was confirmed that, in Example 17, yellowing of reflector part was prevented and a decrease in the output was prevented, by the formation of the high-reflective coating member.

INDUSTRIAL APPLICABILITY

The curable composition of the invention is excellent in light-shielding ability and is highly resistant to light and, therefore, can be used as a light-shielding paste. Further, the curable composition of the invention is low in fluidity and, therefore, light-emitting diodes with the curing product formed on the LED package sidewalls alone can be obtained by using that curable composition. Furthermore, according to the method of light-shielding resin layer formation according to the invention, it is possible to efficiently apply a light-shielding paste to the LED package sidewalls alone for light-shielding resin layer formation, whereby the productivity is markedly improved.

The invention claimed is:

1. A light-shielding paste which contains, as essential components, (A) an organic compound containing at least two carbon-carbon double bonds reactive with a SiH group in each molecule, (B) a silicon compound having at least two SiH groups in each molecule, (C) a hydrosilylation catalyst, (D) a silane coupling agent and/or an epoxy group-containing compound, (E) a silanol condensation catalyst, and (F) titanium oxide
(F) titanium oxide being of rutile type and having an average particle diameter of 0.1 to 1.0 µm, wherein the amount of (F) titanium oxide in the light-shielding paste is not less than 5% by weight of the total weight of the light shielding paste
wherein the component (A) is a mixture of triallyl isocyanurate and monoglycidyl diallyl isocyanurate and the component (B) is the reaction product from 1,3,5,7 tetramethylcyclotetrasiloxane and triallyl isocyanurate.

2. A light-shielding paste which contains, as essential components, (A) an organic compound containing at least two carbon-carbon double bonds reactive with a SiH group in each molecule, (B) a silicon compound having at least two SiH groups in each molecule, (C) a hydrosilylation catalyst, (D) a silane coupling agent and/or an epoxy group-containing compound, (E) a silanol condensation catalyst, and (F) titanium oxide,
(F) titanium oxide being of rutile type and having an average particle diameter of 0.1 to 1.0 µm, wherein the amount of (F) titanium oxide in the light-shielding paste is not less than 5% by weight of the total weight of the light shielding paste
wherein the component (E) is at least one species selected from the group consisting of trinormaloctadecyl borate, trinormaloctyl borate, trinormalbutyl borate, triisopropyl borate, trinormalpropyl borate, triethyl borate and trimethyl borate.

3. The light-shielding paste according to claim 1, which further contains (G) silica.

4. The light-shielding paste according to claim 3, wherein the average primary particle diameter of silica (G) is 3 to 20 nm.

5. The light-shielding paste according to claim 3, which shows such a flow leveling property that when the light-shielding paste is allowed to stand on a glass substrate inclined at an angle of 80 degrees at 100° C. for 1 hour, the flow-out distance is not longer than 2 cm.

6. The light-shielding paste according to claim 3, which is obtained by admixing the component (F) and component (G) with a mixture of the components (A) to (E).

7. A light-shielding resin resulting from curing of the light-shielding paste according to claim 1.

8. A LED package which has the light-shielding resin according to claim 7 substantially on the LED package aperture sidewalls alone.

9. The LED package according to claim 8 which is made of a resin.

10. The LED package according to claim 8, wherein a LED package-forming resin is a composition containing a semicrystalline polymer resin.

11. The LED package according to claim 8 which is made of a ceramic.

12. The LED package according to claim 8 the aperture of which is rectangular.

13. The LED package according to claim 8 the aperture of which is circular.

14. The LED package according to claim 8 the aperture of which is elliptical.

15. A semiconductor device having a LED package and a light-emitting element mounted on the bottom of the LED package; in which the LED package, which has an aperture comprising a bottom and sidewalls and is formed of a molding resin by a monolithic process with the respective ends of an external positive electrode and an external negative electrode being exposed at a predetermined distance on the aperture bottom; is coated with the light-shielding paste according to claim 1 and/or has the light-shielding resin according to claim 7 as formed for shielding against light substantially on the side-walls alone of the LED package.

16. The semiconductor device according to claim 15, wherein a LED package-forming resin is a composition containing a semicrystalline polymer resin.

17. The light-shielding paste according to claim 2, which further contains (G) silica.

18. The light-shielding paste according to claim 17, wherein the average primary particle diameter of silica (G) is 3 to 20 nm.

19. The light-shielding paste according to claim 17, which shows such a flow leveling property that when the light-shielding paste is allowed to stand on a glass substrate inclined at an angle of 80 degrees at 100° C. for 1 hour, the flow-out distance is not longer than 2 cm.

20. The light-shielding paste according to claim 17, which is obtained by admixing the component (F) and component (G) with a mixture of the components (A) to (E).

21. A light-shielding resin resulting from curing of the light-shielding paste according to claim 2.

22. A LED package which has the light-shielding resin according to claim 21 substantially on the LED package aperture sidewalls alone.

23. The LED package according to claim 22 which is made of a resin.

24. The LED package according to claim 22, wherein a LED package-forming resin is a composition containing a semicrystalline polymer resin.

25. The LED package according to claim 22 which is made of a ceramic.

26. The LED package according to claim 22 the aperture of which is rectangular.

27. The LED package according to claim 22 the aperture of which is circular.

28. The LED package according to claim 22 the aperture of which is elliptical.

29. A semiconductor device having a LED package and a light-emitting element mounted on the bottom of the LED package; in which the LED package, which has an aperture comprising a bottom and sidewalls and is formed of a molding resin by a monolithic process with the respective ends of an external positive electrode and an external negative electrode being exposed at a predetermined distance on the aperture bottom; is coated with the light-shielding paste according to claim 2 and/or has the light-shielding resin according to claim 21 as formed for shielding against light substantially on the side-walls alone of the LED package.

30. The semiconductor device according to claim 29, wherein a LED package-forming resin is a composition containing a semicrystalline polymer resin.

* * * * *